(12) United States Patent
Kawahara et al.

(10) Patent No.: US 11,750,090 B2
(45) Date of Patent: Sep. 5, 2023

(54) SEMICONDUCTOR DEVICE AND POWER CONVERSION DEVICE

(71) Applicant: Mitsubishi Electric Corporation, Tokyo (JP)

(72) Inventors: Chihiro Kawahara, Tokyo (JP); Shinya Yano, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 188 days.

(21) Appl. No.: 17/415,728

(22) PCT Filed: Feb. 1, 2019

(86) PCT No.: PCT/JP2019/003662
§ 371 (c)(1),
(2) Date: Jun. 18, 2021

(87) PCT Pub. No.: WO2020/157963
PCT Pub. Date: Aug. 6, 2020

(65) Prior Publication Data
US 2022/0077771 A1    Mar. 10, 2022

(51) Int. Cl.
*H02M 7/219* (2006.01)
*H02M 3/00* (2006.01)
(Continued)

(52) U.S. Cl.
CPC ......... *H02M 3/003* (2021.05); *H02M 1/0009* (2021.05); *H02M 1/34* (2013.01);
(Continued)

(58) Field of Classification Search
CPC ...... H02M 3/003; H02M 1/0009; H02M 1/34; H02M 3/155; H02M 5/293; H02M 7/003;
(Continued)

(56) References Cited

U.S. PATENT DOCUMENTS

2012/0106220 A1* 5/2012 Yamaguchi ............ H05K 7/209
363/131
2020/0105677 A1* 4/2020 Chiba ................. H01L 23/5389

FOREIGN PATENT DOCUMENTS

JP       2016-146444 A    8/2016
JP         6206338 B2    10/2017
JP       2018-85452 A     5/2018

OTHER PUBLICATIONS

International Search Report and Written Opinion dated Apr. 2, 2019, received for PCT Application PCT/JP2019/003662, filed on Feb. 1, 2019, 7 pages including English Translation.

* cited by examiner

*Primary Examiner* — Gary L Laxton
(74) *Attorney, Agent, or Firm* — XSENSUS LLP

(57) ABSTRACT

A semiconductor device includes a substrate having a first surface, a first electrode, a second electrode and a third electrode formed on the first surface, a first semiconductor element and a second semiconductor element disposed in the interior of the substrate, a first wiring group electrically connecting the first electrode to the first semiconductor element, and a fourth wiring group electrically connecting the second semiconductor element to the second electrode. The first wiring group includes a first connection part disposed in the interior of the substrate. The fourth wiring group includes a second connection part disposed in the interior of the substrate. When a voltage is applied between the first electrode and the third electrode to cause current to flow through the second electrode, a direction of current flowing through first connection part is opposite to a direction of current flowing through the second connection part.

16 Claims, 18 Drawing Sheets

(51) Int. Cl.
*H02M 1/00* (2006.01)
*H02M 1/34* (2007.01)
*H02M 3/155* (2006.01)
*H02M 5/293* (2006.01)
*H02M 7/00* (2006.01)
H02M 7/5387 (2007.01)

(52) U.S. Cl.
CPC ........... *H02M 3/155* (2013.01); *H02M 5/293* (2013.01); *H02M 7/003* (2013.01); *H02M 7/5387* (2013.01)

(58) Field of Classification Search
CPC ............ H02M 7/42; H02M 7/44; H02M 7/48; H02M 7/53; H02M 7/537; H02M 7/5387
See application file for complete search history.

SEMICONDUCTOR DEVICE AND POWER CONVERSION DEVICE

CROSS-REFERENCE TO RELATED APPLICATION

The present application is based on PCT filing PCT/JP2019/003662, filed Feb. 1, 2019, the entire contents of which are incorporated herein by reference.

TECHNICAL FIELD

The present invention relates to a semiconductor device and a power conversion device.

BACKGROUND ART

Conventionally, semiconductor devices for use in power conversion devices are known. Semiconductor devices are called power semiconductor modules and include, for example, insulated gate bipolar transistors (IGBTs) or metal-oxide-semiconductor field-effect transistors (MOSFETs) as semiconductor elements.

Japanese Patent Laying-Open No. 2016-146444 discloses a semiconductor device that is aimed to improve the design flexibility of a power semiconductor module containing an electronic component while suppressing increase in wiring inductance. The semiconductor device includes an insulating substrate, a printed circuit board having a feed electrode for main current for a semiconductor element, a printed circuit board stacked on the printed circuit board and having a semiconductor element mounted thereon, and a conductive post connecting the feed electrode to an electrode of the semiconductor element.

CITATION LIST

Patent Literature

PTL 1: Japanese Patent Laying-Open No. 2016-146444

SUMMARY OF INVENTION

Technical Problem

Unfortunately, in the semiconductor device described above, since a plurality of printed circuit boards are stacked, parasitic inductance of wiring is not sufficiently reduced. Therefore, when the semiconductor element performs switching operation at high speed, a surge voltage exceeding the withstand voltage of the semiconductor element may be applied to the semiconductor element and destroy the semiconductor element.

A main object of the present invention is to provide a semiconductor device and a power conversion device with high reliability even in high-speed switching operation.

Solution to Problem

A semiconductor device according to the present invention includes: a substrate having a first surface and a second surface located on a side opposite to the first surface; a first electrode, a second electrode, and a third electrode formed on the first surface; a first semiconductor element and a second semiconductor element disposed in interior of the substrate; a first wiring group electrically connecting the first electrode to the first semiconductor element; a second wiring group electrically connecting the first semiconductor element to the second electrode; a third wiring group electrically connecting the third electrode to the second semiconductor element; and a fourth wiring group electrically connecting the second semiconductor element to the second electrode. The first wiring group includes a first connection part disposed in the interior of the substrate and extending in a direction intersecting the first surface. The fourth wiring group includes a second connection part disposed in the interior of the substrate and extending in the intersecting direction. When a voltage is applied between the first electrode and the third electrode to cause current to flow through the second electrode, a direction of current flowing through the first connection part is opposite to a direction of current flowing through the second connection part.

Advantageous Effects of Invention

The present invention provides a semiconductor device and a power conversion device with high reliability even in high-speed switching operation.

DESCRIPTION OF EMBODIMENTS

Figure 1:
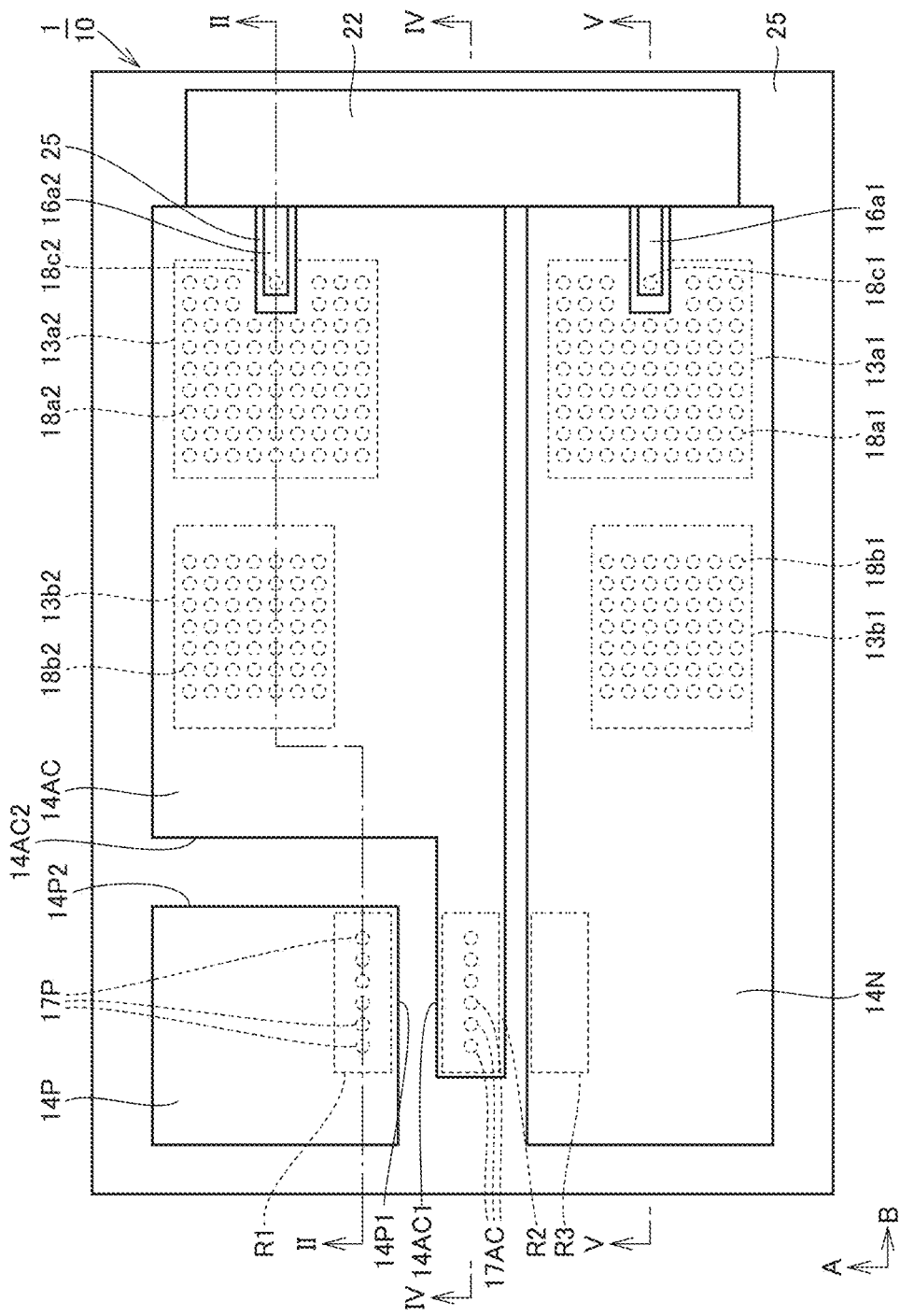
FIG. 1 is a top view of a semiconductor device according to a first embodiment.
Figure 2:
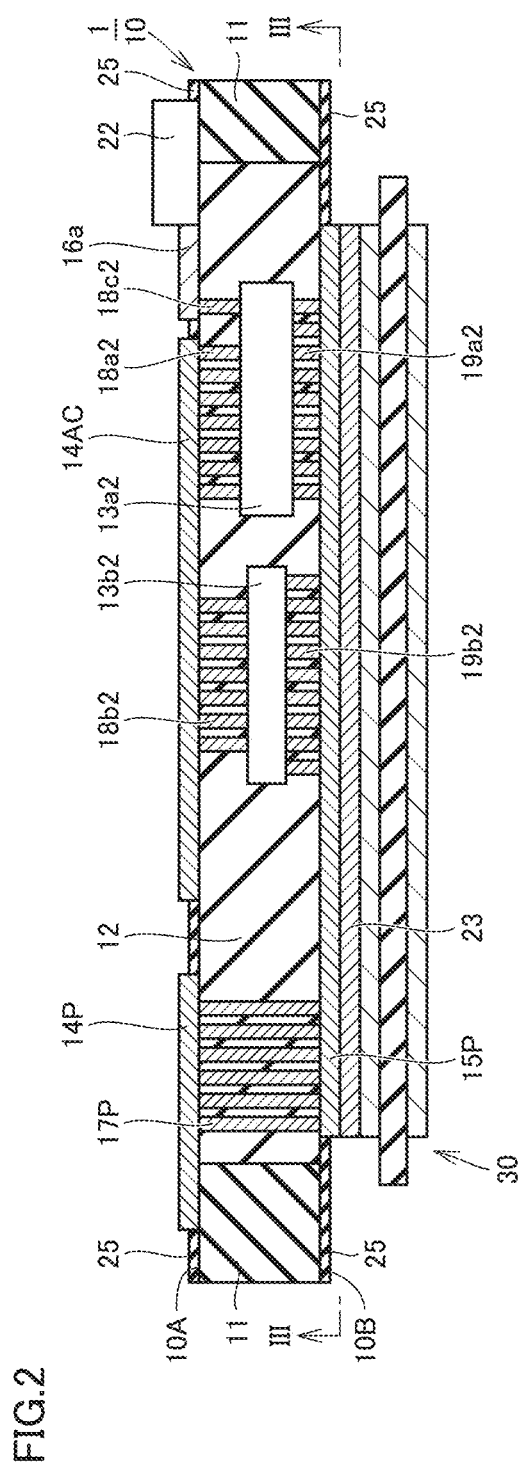
FIG. 2 is a cross-sectional view taken along arrow II-II in FIG. 1.

Embodiments according to the present invention will be described below with reference to the drawings. Like or

First Embodiment

Configuration of Semiconductor Device

As shown in FIG. 1 to FIG. 5, a semiconductor device 1 according to a first embodiment includes a substrate 10, and a first semiconductor element and a second semiconductor element disposed in the interior of substrate 10.

Substrate 10 has a first surface 10A and a second surface 10B located on the opposite side to first surface 10A. Hereinafter, the directions in which first surface 10A and second surface 10B extend are referred to as a first direction A and a second direction B. Second direction B intersects first direction A. A direction intersecting first surface 10A and second surface 10B is referred to as a third direction. The third direction intersects first direction A and second direction B. The third direction is, for example, a direction orthogonal to first surface 10A and second surface 10B.

Substrate 10 includes a core material 11 and a sealing resin material 12. Core material 11 is formed as a core for retaining the outer shape of semiconductor device 1 and provided, for example, in an annular shape as viewed from first surface 10A. At first surface 10A and second surface 10B, core material 11 and sealing resin material 12 are exposed.

Core material 11 and sealing resin material 12 have electrically insulating properties. Core material 11 is, for example, a plate material made of glass fiber impregnated with epoxy resin and, for example, formed of flame retardant type 4 (FR-4). Sealing resin material 12 is disposed in a region surrounded by core material 11. Sealing resin material 12 is formed of, for example, epoxy resin or a prepreg material made of glass fiber impregnated with epoxy resin.

The first semiconductor element and the second semiconductor element are connected in series between a first electrode 14P and a third electrode 14N and configured as vertical semiconductor elements. The first semiconductor element includes, for example, an insulated gate bipolar transistor (IGBT) element 13a2 and a freewheel diode 13b2. The second semiconductor element includes, for example, an IGBT element 13a1 and a freewheel diode 13b1. The freewheel diode is, for example, a Schottky barrier diode (SBD) or a PIN diode. It is noted that the first semiconductor element and the second semiconductor element are not limited to the aforementioned configuration. The first semiconductor element and the second semiconductor element may include at least one selected from the group consisting of IGBT, MOSFET, reverse-conducting IGBT (RCIGBT), bipolar junction transistor (BJT), gate turn-off thyristor (GTO), and gate commutated turn-off thyristor (GCT). When the first semiconductor element and the second semiconductor element include a MOSFET or RCIGBT, they do not necessarily include the freewheel diode described above. The material forming the first semiconductor element and the second semiconductor element is not limited, and examples include silicon (Si) and wide-bandgap semiconductor materials such as gallium nitride (GaN), silicon carbide (SiC), gallium oxide ($Ga_2O_3$), and diamond (C).

IGBT elements 13a1, 13a2 and freewheel diodes 13b1, 13b2 are disposed in the interior of substrate 10 and surrounded and covered with sealing resin material 12. IGBT element 13a1 and freewheel diode 13b1 are formed as the second semiconductor element. IGBT element 13a2 and freewheel diode 13b2 are formed as the first semiconductor element.

Each of IGBT elements 13a1, 13a2 has a collector electrode as a positive electrode, an emitter electrode as a negative electrode, and a gate electrode as a control electrode. Each of freewheel diodes 13b1, 13b2 has an anode electrode as a positive electrode and a cathode electrode as a negative electrode. The respective emitter electrodes and the respective gate electrodes of IGBT elements 13a1, 13a2 and the respective anode electrodes of freewheel diodes 13b1, 13b2 are disposed on the first surface 10A side. The respective collector electrodes of IGBT elements 13a1, 13a2 and the respective cathode electrodes of freewheel diodes 13b1, 13b2 are disposed on the second surface 10B side.

Semiconductor device 1 further includes a first electrode 14P, a second electrode 14AC, a third electrode 14N, control electrodes 16a1, 16a2, and a controller 22, which are disposed on first surface 10A of substrate 10. First electrode 14P and second electrode 14AC are disposed, for example, at a distance from each other in first direction A and second direction B. Second electrode 14AC and third electrode 14N are disposed, for example, at a distance from each other in first direction A. First electrode 14P and third electrode 14N are disposed such that second electrode 14AC is interposed therebetween in first direction A.

As shown in FIG. 1, the distance in first direction A between first electrode 14P and second electrode 14AC is shorter than the distance in second direction B between first electrode 14P and second electrode 14AC.

As shown in FIG. 1, first electrode 14P and second electrode 14AC have a first pair of opposing sides 14P1, 14AC1 facing each other in first direction A. The first pair of opposing sides 14P1, 14AC1 extends along second direction B. First electrode 14P and second electrode 14AC have a third pair of opposing sides 14P2, 14AC2 facing each other in second direction B. The third pair of opposing sides 14P2, 14AC2 extends along second direction B. The distance between opposing sides 14P1 and 14AC1 of the first pair is shorter than the distance between opposing sides 14P2 and 14AC2 of the third pair.

First electrode 14P and second electrode 14AC have a first pair of opposing regions R1, R2 having the first pair of opposing sides 14P1, 14AC1. The first pair of opposing regions R1, R2 includes first region R1 in first electrode 14P and second region R2 in second electrode 14AC. First region R1 is relatively close to second electrode 14AC, compared with the other region in first electrode 14P. Second region R2 is relatively close to first electrode 14P, compared with the other region in second electrode 14AC. First region R1 and second region R2 are disposed at a distance from each other in first direction A. The distance in first direction A between first region R1 and second region R2 is shorter than the distance between the other region excluding first region R1 in first electrode 14P and the other region excluding second region R2 in second electrode 14AC.

Third electrode 14N has a third region R3 disposed at a distance from second region R2 in first direction A and extending along second direction B. Third region R3 is relatively close to second electrode 14AC, compared with the other region in third electrode 14N. The second region R2 is disposed between the first region R1 and the third region R3 in first direction A.

Control electrode 16a1 is disposed at a distance from second electrode 14AC. Control electrode 16a2 is disposed at a distance from third electrode 14N.

On first surface 10A of substrate 10, a protective film 25 is disposed in a region that does not have first electrode 14P, second electrode 14AC, third electrode 14N, control electrodes 16a1, 16a2, and controller 22. On second surface 10B of substrate 10, protective film 25 is disposed in a region that does not have a fourth electrode 15P and a fifth electrode 15AC. Protective film 25 is formed of any material that has electrical insulating properties but preferably formed of a material on which a conductive bonding material such as solder is less likely to wet, and an example thereof is solder resist.

Semiconductor device 1 further includes fourth electrode 15P and fifth electrode 15AC disposed on second surface 10B of substrate 10. Fourth electrode 15P and fifth electrode 15AC are disposed, for example, at a distance from each other in first direction A.

Figure 3:
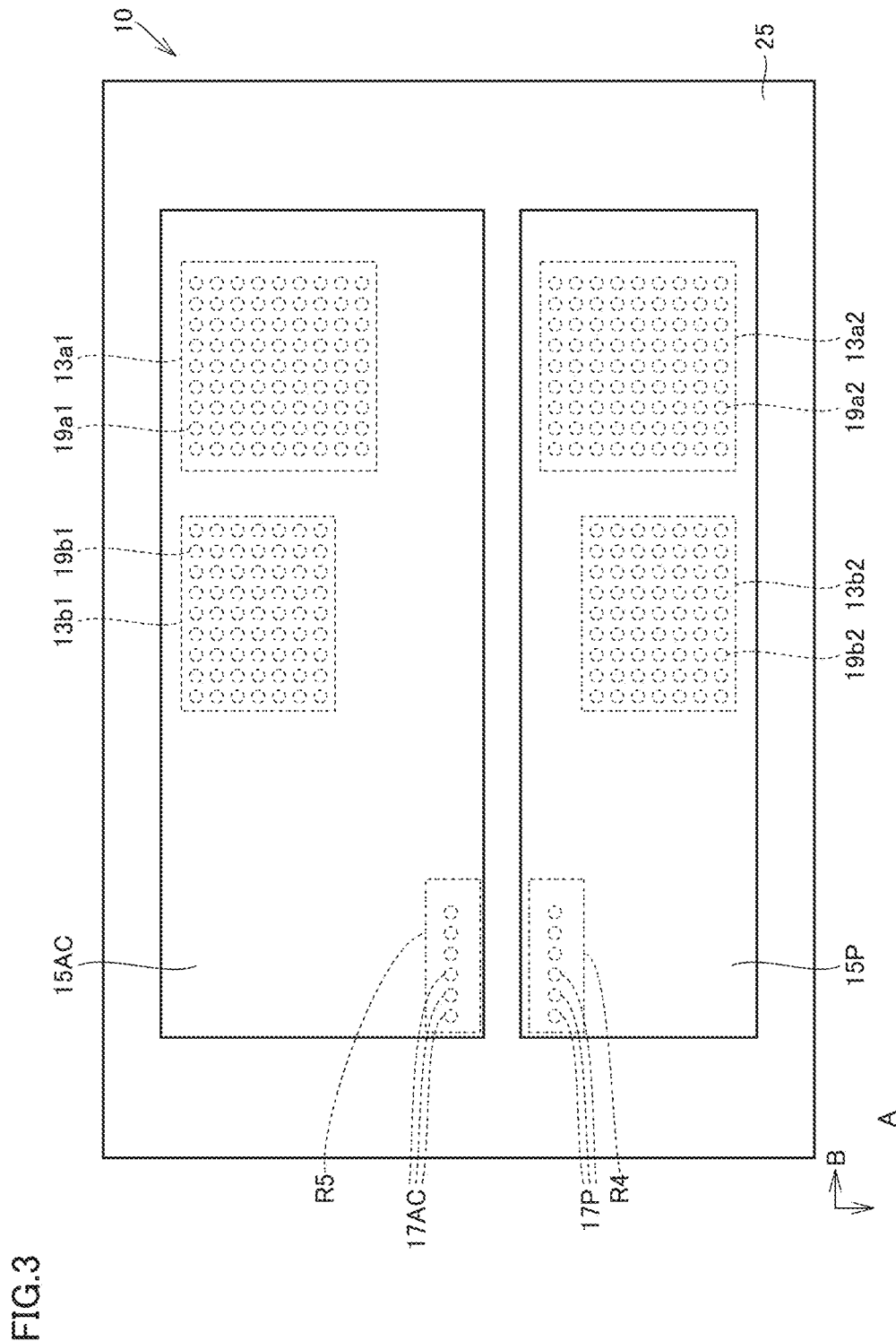
FIG. 3 is a bottom view of a substrate as viewed from arrow III-III in FIG. 2.
Figure 4:
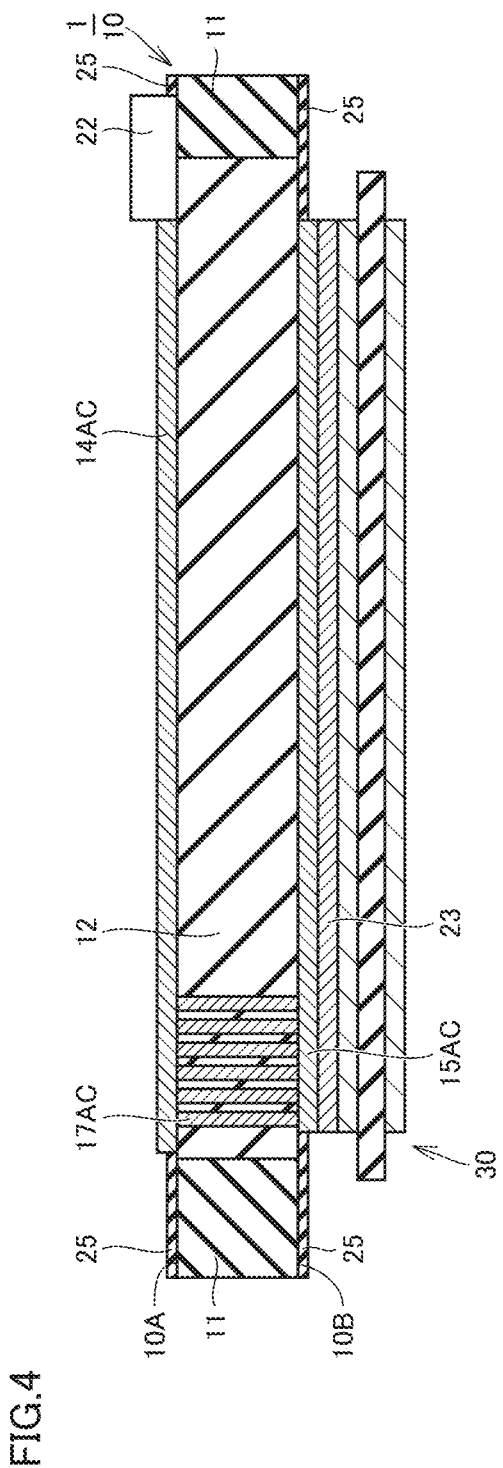
FIG. 4 is a cross-sectional view taken along arrow IV-IV in FIG. 1.
Figure 5:
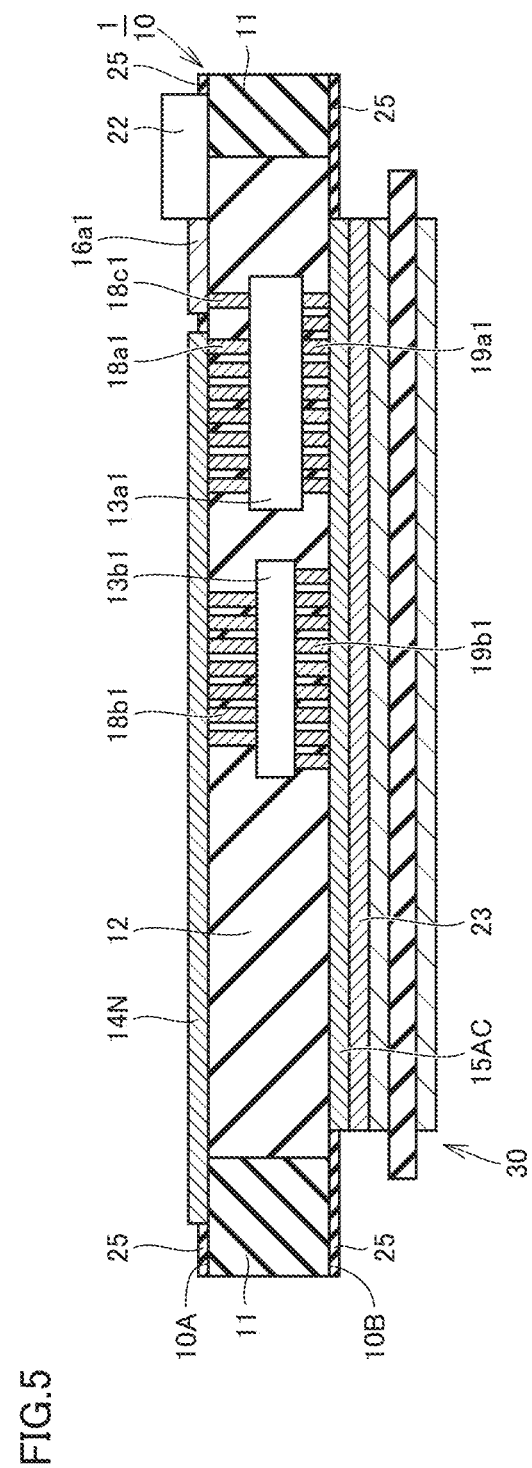
FIG. 5 is a cross-sectional view taken along arrow V-V in FIG. 1.

As shown in FIG. 3, fourth electrode 15P and fifth electrode 15AC have a second pair of opposing sides 15P1, 15AC1 facing each other in first direction A. The second pair of opposing sides 15P1, 15AC1 extends along second direction B.

Fourth electrode 15P and fifth electrode 15AC have a second pair of opposing regions R4, R5 having the second pair of opposing sides 15P1, 15AC1. The second pair of opposing regions R4, R5 includes fourth region R4 in fourth electrode 15P and fifth region R5 in fifth electrode 15AC. Fourth region R4 is relatively close to fifth electrode 15AC, compared with the other region in fourth electrode 15P. Fifth region R5 is relatively close to fourth electrode 15P, compared with the other region in fifth electrode 15AC. Fourth region R4 and fifth region R5 are disposed at a distance from each other in first direction A. The distance in first direction A between fourth region R4 and fifth region R5 is shorter than the distance between the other region excluding fourth region R4 in fourth electrode 15P and the other region excluding fifth region R5 in fifth electrode 15AC.

As shown in FIG. 3, at least a part of fourth region R4 of fourth electrode 15P is provided, for example, so as to overlap first region R1 of first electrode 14P in the third direction. At least a part of fifth region R5 of fifth electrode 15AC is provided, for example, so as to overlap second region R2 of second electrode 14AC in the third direction.

In fourth region R4, a region overlapping first region R1 in the third direction is referred to as a sixth region, and in the fifth region R5, a region overlapping second region R2 in the third direction is referred to as a seventh region. First region R1 of first electrode 14P and the sixth region of fourth electrode 15P are connected through a first via 17P (first connection part) described later. Second region R2 of second electrode 14AC and the seventh region of fifth electrode 15AC are connected through a second via 17AC (second connection part) described later.

Semiconductor device 1 further includes a plurality of vias disposed in the interior of substrate 10. The material forming the vias has electrical conductivity and includes, for example, copper (Cu) or aluminum (Al). Each via extends along the third direction.

First via 17P connects first region R1 of first electrode 14P to the sixth region of fourth electrode 15P. Second via 17AC connects second region R2 of second electrode 14AC to the seventh region of fifth electrode 15AC.

A third via 18a2 connects the emitter electrode of IGBT element 13a2 to second electrode 14AC. A fourth via 19a2 connects the collector electrode of IGBT element 13a2 to fourth electrode 15P. A fifth via 18b2 connects the anode electrode of freewheel diode 13b2 to second electrode 14AC. A sixth via 19b2 connects the cathode electrode of freewheel diode 13b2 to fourth electrode 15P.

A seventh via 18a1 connects the emitter electrode of IGBT element 13a1 to third electrode 14N. An eighth via 19a1 connects the collector electrode of IGBT element 13a1 to fifth electrode 15AC. A ninth via 18b1 connects the anode electrode of freewheel diode 13b1 to third electrode 14N. A tenth via 19b1 connects the cathode electrode of freewheel diode 13b1 to fifth electrode 15AC.

An eleventh via 18c2 connects the gate electrode of IGBT element 13a2 to control electrode 16a2. A twelfth via 18c1 connects the gate electrode of IGBT element 13a1 to control electrode 16a1.

First electrode 14P and the collector electrode of IGBT element 13a2 as the first semiconductor element are electrically connected through first via 17P, fourth electrode 15P, and fourth via 19a2. First electrode 14P and the cathode electrode of freewheel diode 13b2 as the first semiconductor element are electrically connected through first via 17P, fourth electrode 15P, and sixth via 19b2. First via 17P, fourth electrode 15P, and fourth via 19a2, as well as first via 17P, fourth electrode 15P, and sixth via 19b2 are referred to as a first wiring group.

The emitter electrode of IGBT element 13a2 and second electrode 14AC are electrically connected through third via 18a2. The anode electrode of freewheel diode 13b2 and second electrode 14AC are electrically connected through fifth via 18b2. Third via 18a2 and fifth via 18b2 are referred to as a second wiring group.

Third electrode 14N and IGBT element 13a1 as the second semiconductor element are electrically connected through seventh via 18a1. Third electrode 14N and the anode electrode of freewheel diode 13b1 are electrically connected through ninth via 18b1. Seventh via 18a1 and ninth via 18b1 are referred to as a third wiring group.

The collector electrode of IGBT element 13a1 and second electrode 14AC are electrically connected through eighth via 19a1, fifth electrode 15AC, and second via 17AC. The cathode electrode of freewheel diode 13b1 and second electrode 14AC are electrically connected through tenth via 19b1, fifth electrode 15AC, and second via 17AC. Eighth via 19a1, fifth electrode 15AC, and second via 17AC, as well as tenth via 19b1, fifth electrode 15AC, and second via 17AC are referred to as a fourth wiring group.

First electrode 14P and second electrode 14AC are connected through the first wiring group, IGBT element 13a2 and freewheel diode 13b2, the second wiring group. Third electrode 14N and second electrode 14AC are connected through the third wiring group, IGBT element 13a1 and freewheel diode 13b1, the fourth wiring group.

In the first wiring group, first electrode 14P and fourth electrode 15P are connected only through first via 17P. In the fourth wiring group, second electrode 14AC and fifth electrode 15AC are connected only through second via 17AC.

The distance between first via 17P and second via 17AC is shorter than the shortest distance between third via 18a2 and seventh via 18a1, the shortest distance between fourth via 19a2 and eighth via 19a1, the shortest distance between fifth via 18b2 and ninth via 18b1, and the shortest distance between sixth via 19b2 and tenth via 19b1.

First via 17P connects the collector electrode of IGBT element 13a2 and the cathode electrode of freewheel diode 13b2 to first electrode 14P. Second via 17AC connects the collector electrode of IGBT element 13a1 and the cathode electrode of freewheel diode 13b1 to an output terminal. Semiconductor device 1 is provided such that when a voltage is applied between first electrode 14P and third electrode 14N to cause current to flow through second electrode 14AC, the direction of current flowing through first via 17P is opposite to the direction of current flowing through second via 17AC.

First via 17P, second via 17AC, third via 18a2, fourth via 19a2, fifth via 18b2, sixth via 19b2, seventh via 18a1, eighth via 19a1, ninth via 18b1, tenth via 19b1, eleventh via 18c2, and twelfth via 18c1 have, for example, a plurality of pillar-shaped portions. The pillar portions are provided so as to extend along the third direction in the interior of sealing resin material 12.

First via 17P and second via 17AC have a plurality of pillar-shaped portions, for example, disposed at a distance from each other in second direction B and extending along the third direction. The pillar-shaped portions of first via 17P are disposed at a distance from the pillar-shaped portions of second via 17AC, for example, in first direction A. The distances between the pillar-shaped portions of first via 17P are, for example, equal. The distances between the pillar-shaped portions of second via 17AC are, for example, equal. The distances in first direction A between the pillar-shaped portions of first via 17P and the pillar-shaped portions of second via 17AC are, for example, equal. The diameter of each pillar-shaped portion of first via 17P and second via 17AC is, for example, a few tens of μm or larger and a few hundreds of μm or smaller. For example, in one semiconductor device 1 with rated current of 30 A, each of first via 17P and second via 17AC has about 200 pillar-shaped portions each having a diameter of 100 μm.

Third via 18a2, fourth via 19a2, fifth via 18b2, sixth via 19b2, seventh via 18a1, eighth via 19a1, ninth via 18b1, and tenth via 19b1 are disposed at a distance from each other, for example, in first direction A and second direction B and have a plurality of pillar-shaped portions extending along the third direction.

First electrode 14P is connected to the positive electrode of the main capacitor in the power conversion device. Third electrode 14N is connected to the negative electrode of the main capacitor in the power conversion device. Second electrode 14AC is connected to the output terminal.

The respective gate electrodes of IGBT elements 13a1, 13a2 are connected to controller 22 through control electrodes 16a1, 16a2.

Fourth electrode 15P and fifth electrode 15AC are connected to insulating substrate 30 through a connection member 23. The material forming connection member 23 includes, for example, a material having a relatively high heat conductivity and includes, for example, solder or sintered silver.

Insulating substrate 30 is, for example, a laminated substrate of a ceramic plate material and a metal plate material, such as direct bonded copper (DBC) or direct bonded aluminum (DBA), or a resin insulating substrate including a resin insulating layer. In insulating substrate 30, a surface on the opposite side to the surface connected to fourth electrode 15P and fifth electrode 15AC is connected to a heat sink or a water-cooling cooler through a thermal interface material (TIM) such as grease or a heat conductive sheet.

Although the semiconductor device 1 described above is configured as a module containing two switching elements (2-in-1 module), it may include three or more switching elements.

Insulating substrate 30 may be formed as, for example, a carbon sheet containing carbon in its constituent materials.

Fourth electrode 15P and fifth electrode 15AC may be connected to a radiator such as a heat sink through a member having electrical insulating properties, such as an insulator or a resin spacer, instead of insulating substrate 30. In the heat sink, the portions connected to fourth electrode 15P and fifth electrode 15AC may have electrical insulating properties.

Method of Manufacturing Semiconductor Device

Semiconductor device 1 is manufactured, for example, by the following method. First, core material 11 is prepared. Core material 11 has openings in accordance with the shapes of IGBT elements 13a1, 13a2 and freewheel diodes 13b1, 13b2. The openings are formed, for example, by boring in a plate material by any processing machine. Subsequently, IGBT elements 13a1, 13a2 and freewheel diodes 13b1, 13b2 are arranged in the openings of core material 11, and the openings are filled with a sealing resin material. Substrate 10 is thus formed.

Subsequently, a plurality of holes are formed in substrate 10 to extend from first surface 10A and second surface 10B to IGBT elements 13a1, 13a2 or freewheel diodes 13b1, 13b2. The holes are formed, for example, by boring in substrate 10 by a laser processing machine. The inner diameter of each hole is, for example, a few hundreds of μm.

Subsequently, a plurality of through holes are formed in substrate 10 to penetrate first surface 10A to second surface 10B. The through holes are formed, for example, by boring by a drill or a router. The inner diameter of each hole is, for example, a few hundreds of μm.

Subsequently, the holes and the through holes are filled with a conductive material, for example, by plating. First via 17P, second via 17AC, third via 18a2, fourth via 19a2, fifth via 18b2, sixth via 19b2, seventh via 18a1, eighth via 19a1, ninth via 18b1, tenth via 19b1, eleventh via 18c2, and twelfth via 18c1 are thus formed.

Subsequently, first electrode 14P, second electrode 14AC, and third electrode 14N are formed on first surface 10A. Fourth electrode 15P and fifth electrode 15AC are formed on second surface 10B. First electrode 14P, second electrode 14AC, third electrode 14N, fourth electrode 15P, and fifth electrode 15AC are formed, for example, by plating and patterning such as photolithography.

Subsequently, insulating substrate 30 is prepared. Insulating substrate 30 is connected to fourth electrode 15P and fifth electrode 15AC through connection member 23. In this way, semiconductor device 1 is manufactured.

A plurality of holes may be formed after a plurality of through holes are formed. The holes may be formed collectively as one big hole. The holes and the through holes may be filled with, for example, a metal material such as solder or conductive paste.

Semiconductor device 1 according to the first embodiment includes substrate 10, second electrode 14AC and third electrode 14N formed on first surface 10A, fourth electrode 15P and fifth electrode 15AC formed on second surface 10B, and IGBT elements 13a1, 13a2 and freewheel diodes 13b1, 13b2 disposed in the interior of substrate 10.

Semiconductor device 1 further includes first via 17P disposed in the interior of substrate 10 and connecting first electrode 14P to fourth electrode 15P, and second via 17AC disposed in the interior of substrate 10 and connecting second electrode 14AC to fifth electrode 15AC. First via 17P and second via 17AC are provided so as to extend along the third direction. Semiconductor device 1 is provided such that the direction of current flowing through first via 17P is opposite to the direction of current flowing through second via 17AC.

Therefore, a magnetic flux produced in the periphery of first via 17P by current flowing through first via 17P is canceled by a magnetic flux produced in the periphery of second via 17AC by current flowing through second via 17AC. As a result, the parasitic inductance of wiring of semiconductor device 1 is reduced, compared with the parasitic inductance of wiring of a conventional semiconductor device without first via 17P and second via 17AC. As a result, semiconductor device 1 has high reliability even in high-speed switching operation, compared with a conventional semiconductor device without first via 17P and second via 17AC.

Furthermore, first electrode 14P and second electrode 14AC have a first pair of opposing regions R1, R2 having a first pair of opposing sides facing at a distance from each other. Fourth electrode 15P and fifth electrode 15AC have a second pair of opposing regions R4, R5 having a second pair of opposing sides facing at a distance from each other. In other words, first region R1 is relatively close to second electrode 14AC, compared with the other region in first electrode 14P. Second region R2 is relatively close to first electrode 14P, compared with the other region in second electrode 14AC. Fourth region R4 is relatively close to fifth electrode 15AC, compared with the other region in fourth electrode 15P. Fifth region R5 is relatively close to fourth electrode 15P, compared with the other region in fifth electrode 15AC. One end of each of first via 17P and second via 17AC is connected to the corresponding one of the first pair of opposing regions R1, R2. The other end of each of first via 17P and second via 17AC is connected to the corresponding one of the second pair of opposing regions R4, R5.

The distance between first via 17P and second via 17AC in this manner is shorter than the shortest distance between third via 18a2 and seventh via 18a1, the shortest distance between fourth via 19a2 and eighth via 19a1, the shortest distance between fifth via 18b2 and ninth via 18b1, and the shortest distance between sixth via 19b2 and tenth via 19b1. In the semiconductor device 1 described above, therefore, the effect of canceling the aforementioned magnetic flux is enhanced, for example, compared with when the distance between first via 17P and second via 17AC is equal to larger than the shortest distance between third via 18a2 and seventh via 18a1.

Furthermore, in semiconductor device 1, in a current path from the collector electrode of IGBT element 13a1 and the cathode electrode of freewheel diode 13b1 to the output terminal, second electrode 14AC and fifth electrode 15AC are connected only through second via 17AC. In a current path from the collector electrode of IGBT element 13a2 and the cathode electrode of freewheel diode 13b2 to first electrode 14P, first electrode 14P and fourth electrode 15P are connected only through first via 17P. The parasitic inductance of wiring of semiconductor device 1 is therefore reduced, compared with the parasitic inductance of wiring of a semiconductor device including a via connected in parallel with at least one of first via 17P and second via 17AC in the aforementioned current path.

Second Embodiment

Figure 6:
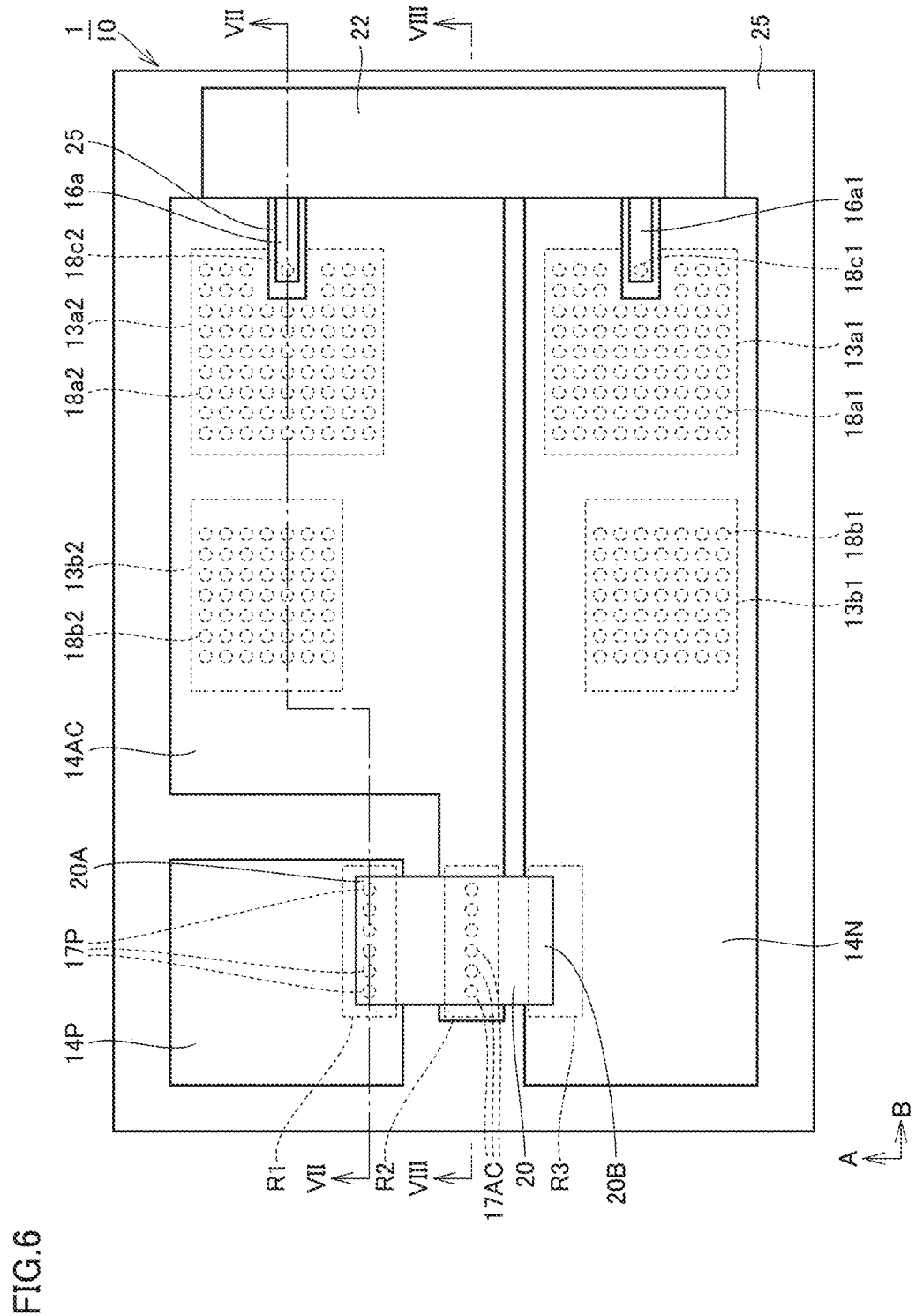
FIG. 6 is a top view of a semiconductor device according to a second embodiment.
Figure 7:
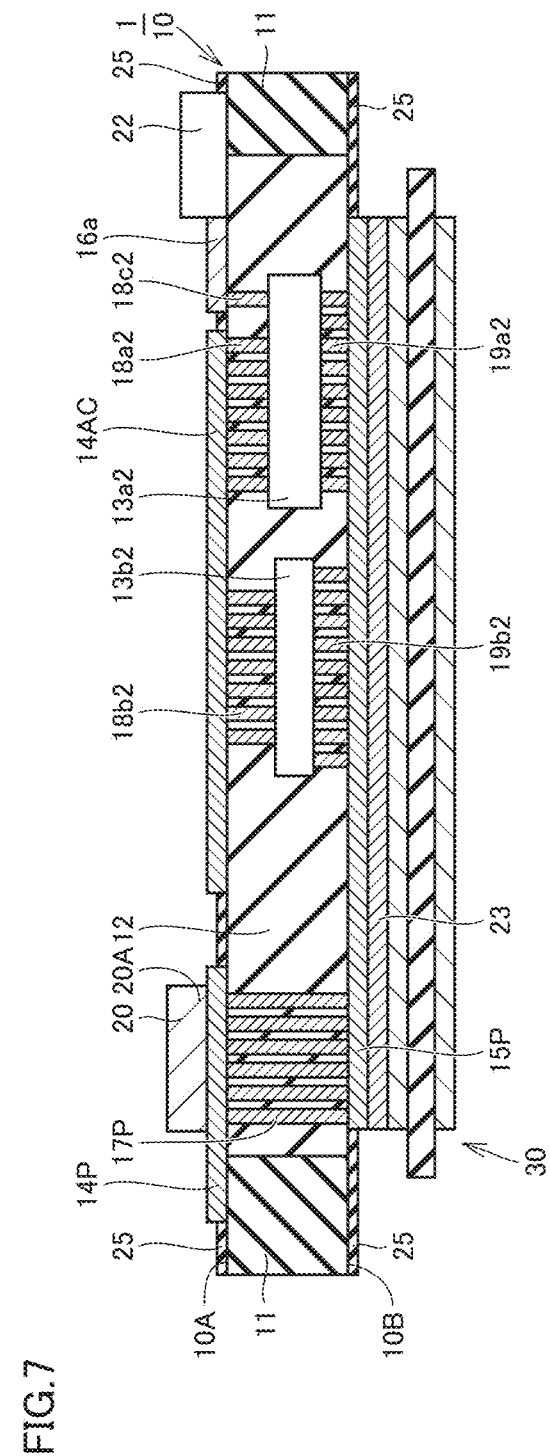
FIG. 7 is a cross-sectional view taken along arrow VII-VII in FIG. 6.
Figure 8:
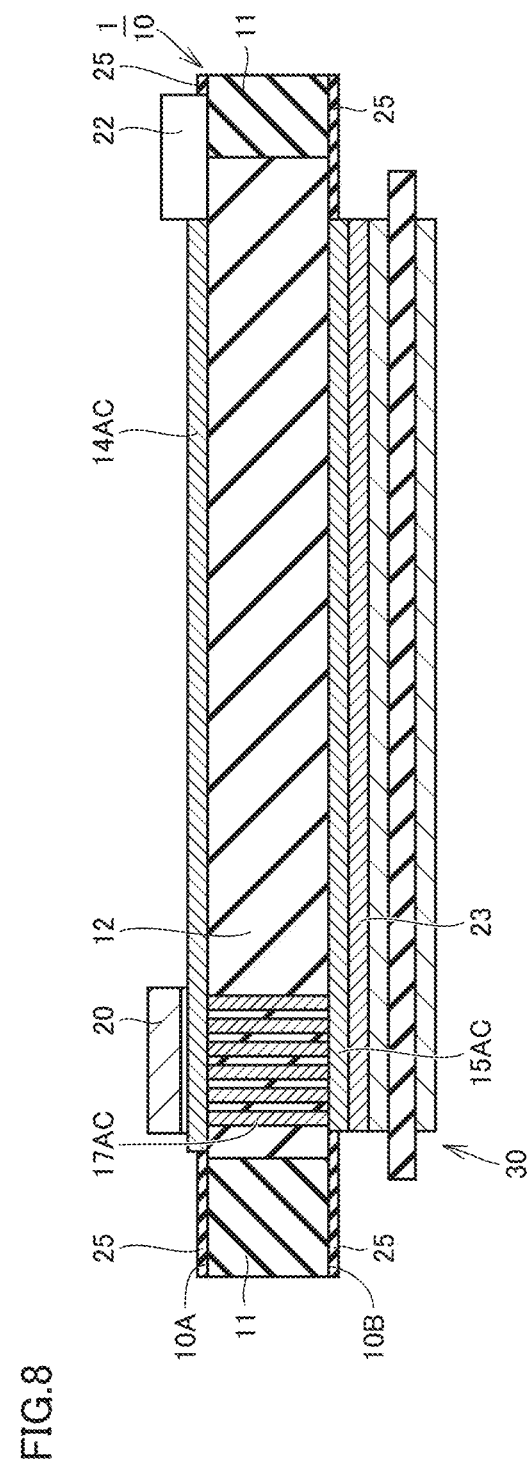
FIG. 8 is a cross-sectional view taken along arrow VIII-VIII in FIG. 6.

As shown in FIG. 6 to FIG. 8, semiconductor device 1 according to a second embodiment basically has a configuration similar to semiconductor device 1 according to the first embodiment but differs in that it further includes a snubber circuit element 20.

Snubber circuit element 20 is configured as a snubber circuit. Snubber circuit element 20, for example, may be configured only with a capacitor, may be configured with a capacitor and a resistor, or may be configured with a capacitor, a resistor, and a diode.

As shown in FIG. 6, snubber circuit element 20 connects first region R1 of first electrode 14P and third region R3 of third electrode 14N. Snubber circuit element 20 has a first connection terminal connected to first region R1 of first electrode 14P and a second connection terminal connected to third region R3 of third electrode 14N. As shown in FIG. 6 and FIG. 7, the first connection terminal of snubber circuit element 20 is disposed so as to overlap first via 17P in the third direction. The first connection terminal of snubber circuit element 20 is connected to first via 17P through first region R1 of first electrode 14P.

As shown in FIG. 8, snubber circuit element 20 is not connected, for example, to second electrode 14AC. The first connection terminal and the second connection terminal of snubber circuit element 20 are provided, for example, in a protruding shape relative to a portion disposed on second electrode 14AC. The thickness of each of first electrode 14P, second electrode 14AC, and third electrode 14N is, for example, constant.

Semiconductor device 1 according to the second embodiment basically has a configuration similar to semiconductor device 1 according to the first embodiment and therefore achieves an effect similar to that of semiconductor device 1 according to the first embodiment.

Furthermore, since semiconductor device 1 according to the second embodiment includes snubber circuit element 20, snubber circuit element 20 absorbs a surge voltage produced at the time of switching by the parasitic inductance of semiconductor device 1. As a result, in semiconductor device 1 according to the second embodiment, IGBT elements 13a1, 13a2 and freewheel diodes 13b1, 13b2 are less likely to be destroyed by the surge voltage.

Furthermore, in semiconductor device 1 according to the second embodiment, since snubber circuit element 20 is disposed so as to overlap first via 17P in the third direction, heat generated in snubber circuit element 20 is efficiently transferred to fourth electrode 15P and fifth electrode 15AC through first via 17P. Therefore, even when the switching speed of IGBT elements 13a1, 13a2 is high and relatively large heat is generated in snubber circuit element 20, the heat can be efficiently dissipated.

Third Embodiment

Figure 9:
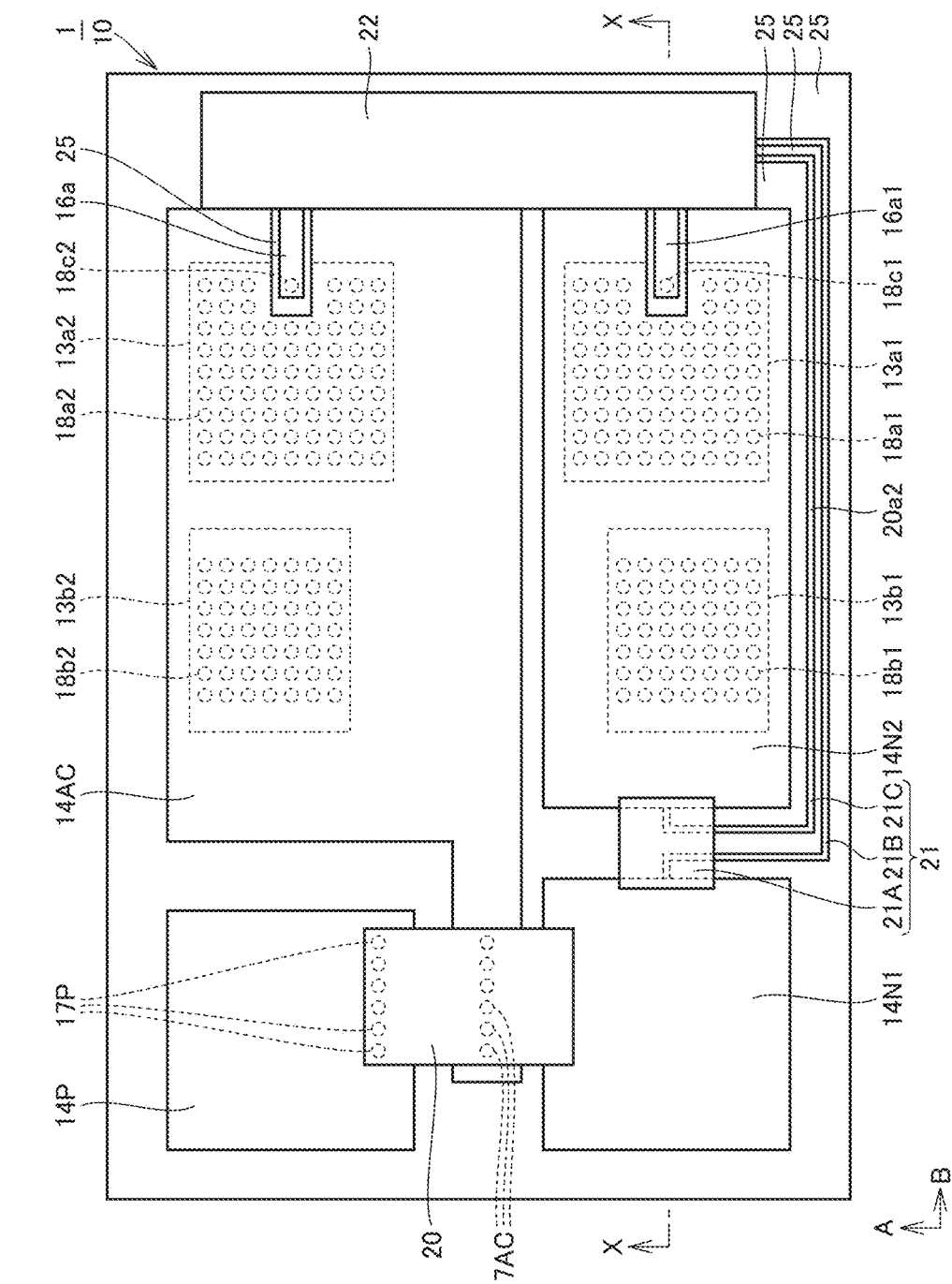
FIG. 9 is a top view of a semiconductor device according to a third embodiment.
Figure 10:
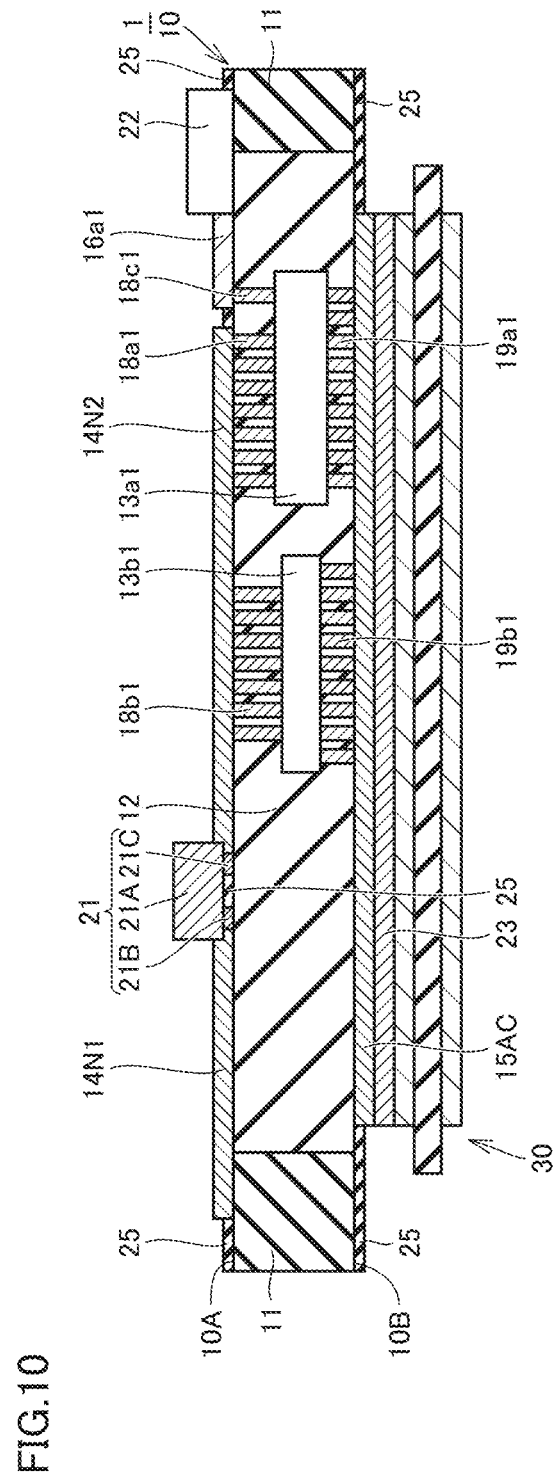
FIG. 10 is a cross-sectional view taken along arrow X-X in FIG. 9.
Figure 11:
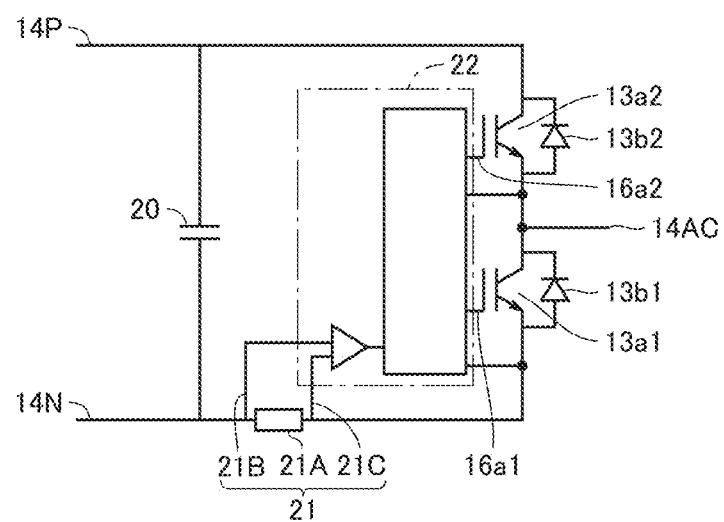
FIG. 11 is a simplified circuit diagram of the semiconductor device according to the third embodiment.

As shown in FIG. 9 to FIG. 11, semiconductor device 1 according to a third embodiment basically has a configuration similar to semiconductor device 1 according to the second embodiment but differs in that it further includes a first current detector 21.

As shown in FIG. 9, third electrode 14N includes a first portion 14N1 and a second portion 14N2. First portion 14N1 has the third region R3 described above. First portion 14N1 is connected to the negative electrode of the main capacitor in the power conversion device. Second portion 14N2 is connected to the emitter electrode of IGBT element 13a1 through seventh via 18a1 and connected to the anode electrode of freewheel diode 13b1 through ninth via 18b1. Second portion 14N2 is disposed, for example, at a distance from first portion 14N1 in second direction B.

First current detector 21 is provided so as to detect change in current flowing through third electrode 14N. As shown in FIG. 9, first current detector 21 includes, for example, a shunt resistor 21A, first wiring 21B, and second wiring 21C. First current detector 21 is disposed between first portion 14N1 and second portion 14N2.

Shunt resistor 21A has one end connected to first portion 14N1 and the other end connected to second portion 14N2. First wiring 21B connects the one end of shunt resistor 21A to controller 22. First wiring 21B is connected to the one end of shunt resistor 21A, for example, through first portion 14N1. Second wiring 21C connects the other end of shunt resistor 21A to controller 22. Second wiring 21C is connected to the other end of shunt resistor 21A, for example, through second portion 14N2. Shunt resistor 21A, first wiring 21B, and second wiring 21C are disposed, for example, on first surface 10A.

As shown in FIG. 10, shunt resistor 21A is disposed, for example, on protective film 25 formed between first portion 14N1 and second portion 14N2. Shunt resistor 21A is formed, for example, by sputtering, plating, or deposition. The material forming shunt resistor 21A is a resistance material having a low resistance temperature coefficient, for example, an alloy containing Cu and nickel (Ni) or an alloy containing Cu, Ni, and manganese (Mn). First wiring 21B and second wiring 21C are disposed, for example, on protective film 25 formed in the periphery of third electrode 14N.

Shunt resistor 21A, first wiring 21B, and second wiring 21C are not limited to the configuration described above. Shunt resistor 21A may be, for example, a commercially available shunt resistor and may be connected to first portion 14N1 and second portion 14N2 of third electrode 14N, for example, through soldering.

Shunt resistor 21A, first wiring 21B, and second wiring 21C may be in contact with first surface 10A of substrate 10. Shunt resistor 21A, first wiring 21B, and second wiring 21C may be formed, for example, simultaneously from one conductive film. Alternatively, shunt resistor 21A, first wiring 21B, and second wiring 21C may be formed, for example, from a plurality of conductive films. Shunt resistor 21A, first wiring 21B, and second wiring 21C may be formed, for example, simultaneously from one conductive film together with first electrode 14P, second electrode 14AC, and third electrode 14N.

Controller 22 is provided so as to control the switching operation of IGBT elements 13a1, 13a2 in accordance with a current value or the amount of change in current detected by first current detector 21. In controller 22, for example, any given determination value is set in advance for a value of reverse current (recovery current value) flowing from the cathode electrode to the anode electrode of each of freewheel diodes 13b1, 13b2 at the time of switching. Controller 22 performs, for example, control of decreasing the switching speed, decreasing the duty ratio, or temporarily stopping the switching operation when the current value detected by first current detector 21 exceeds the determination value.

Semiconductor device 1 according to the third embodiment basically has a configuration similar to semiconductor device 1 according to the first embodiment and therefore achieves an effect similar to that of semiconductor device 1 according to the first embodiment.

Furthermore, since semiconductor device 1 according to the third embodiment includes first current detector 21, the switching speed is decreased, the duty ratio is decreased, or the switching operation is temporarily stopped by controller 22 when the current value detected by first current detector 21 exceeds the determination value. As a result, in semiconductor device 1 according to the third embodiment, excessive heat generation and destruction of IGBT elements 13a1, 13a2 and freewheel diodes 13b1, 13b2 are prevented.

Furthermore, in the semiconductor device 1 described above, heat generated in shunt resistor 21A is transferred to first portion 14N1 and second portion 14N2 of third electrode 14N. First portion 14N1 is formed as a connection portion to the negative electrode of the main capacitor and has a large area compared with shunt resistor 21A. Furthermore, second portion 14N2 is provided so as to overlap IGBT element 13a1 and freewheel diode 13b1 in the third direction and has a large area compared with shunt resistor 21A. Therefore, in the semiconductor device 1 described above, heat generated in shunt resistor 21A can be efficiently dissipated to first portion 14N1 and second portion 14N2 of third electrode 14N.

Furthermore, in the semiconductor device 1 described above, higher integration is achieved compared with when a current detector is provided on the exterior of the semiconductor device.

Fourth Embodiment

Figure 12:
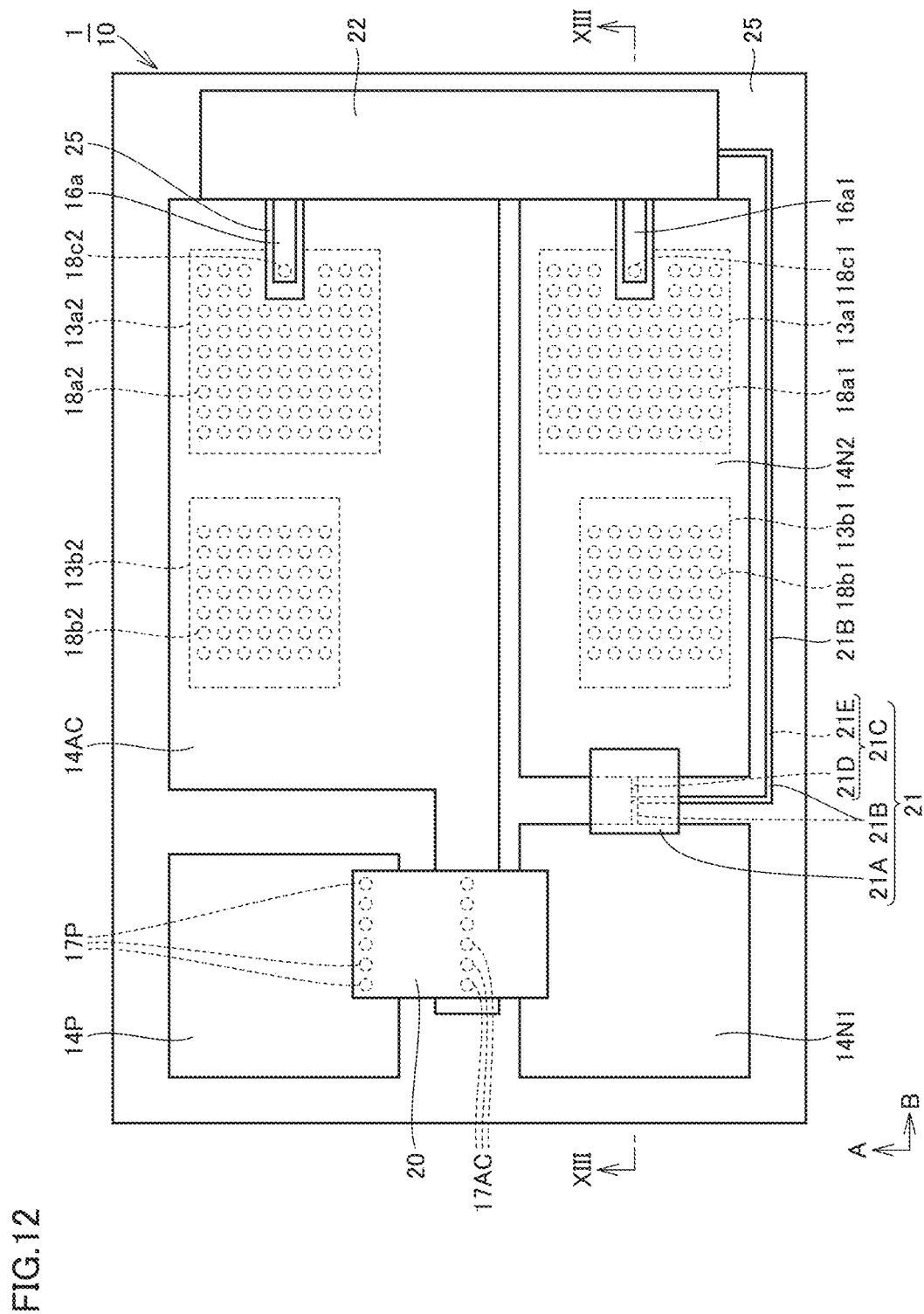
FIG. 12 is a top view of a semiconductor device according to a fourth embodiment.
Figure 13:
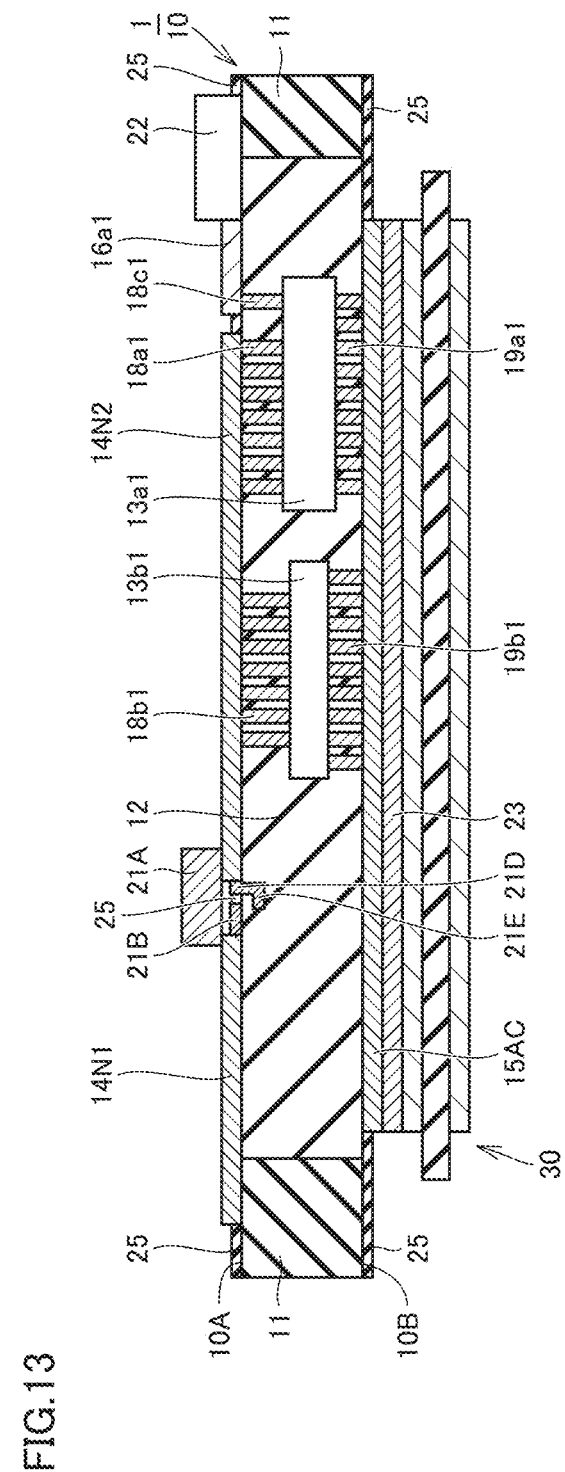
FIG. 13 is a cross-sectional view taken along arrow XIII-XIII in FIG. 12.

Semiconductor device 1 according to a fourth embodiment basically has a configuration similar to semiconductor device 1 according to the third embodiment but differs in that at least one of first wiring 21B and second wiring 21C has a portion disposed in the interior of substrate 10. FIG. 12 and FIG. 13 show semiconductor device 1 in which second wiring 21C is disposed in the interior of substrate 10.

First wiring 21B has a configuration similar to first wiring 21B in semiconductor device 1 according to the third embodiment. Second wiring 21C has an exposed segment 21D disposed on first surface 10A and connected to second portion 14N2 of third electrode 14N, and a buried segment 21E disposed in the interior of substrate 10 and connecting exposed segment 21D to controller 22. Exposed segment 21D is disposed, for example, between first portion 14N1 and second portion 14N2 of third electrode 14N. Buried segment 21E has, for example, a first buried portion connected to exposed segment 21D and extending in the third direction, a second buried portion connected to the first buried portion and extending in the second direction, and a third buried portion connected to the second buried portion and disposed so as to overlap second wiring 21C in the third direction. In other words, first wiring 21B and buried segment 21E of second wiring 21C are disposed in parallel with each other.

As shown in FIG. 12, the first buried portion and the second buried portion of buried segment 21E are arranged, for example, so as to overlap shunt resistor 21A in the third direction. A part of the third buried portion of buried segment 21E is disposed so as to overlap shunt resistor 21A in the third direction. The remaining part of the third buried portion of buried segment 21E is disposed in a region that does not overlap shunt resistor 21A in the third direction. As shown in FIG. 13, the connection part to the third buried portion in the second buried portion of buried segment 21E is disposed, for example, so as to overlap first wiring 21B in the third direction.

Semiconductor device 1 according to the fourth embodiment basically has a configuration similar to semiconductor device 1 according to the third embodiment and therefore achieves an effect similar to that of semiconductor device 1 according to the third embodiment.

Furthermore, in semiconductor device 1 according to the fourth embodiment, since second wiring 21C has buried segment 21E, a space for arranging second wiring 21C is not necessary on first surface 10A. In semiconductor device 1 according to the fourth embodiment, therefore, the area occupied by third electrode 14N is increased by the amount of the space described above. In such a semiconductor device 1, the heat dissipation effect by third electrode 14N is increased, compared with semiconductor device 1 according to the third embodiment.

Furthermore, in semiconductor device 1 according to the fourth embodiment, since first wiring 21B and buried segment 21E of second wiring 21C are arranged in parallel with each other, the influence of disturbance on first wiring 21B and second wiring 21C can be reduced compared with that of semiconductor device 1 according to the third embodiment.

Modifications

Semiconductor device 1 according to the fourth embodiment may have the following configuration. In semiconductor device 1 according to the fourth embodiment, first wiring 21B may have a buried portion buried in the interior of substrate 10, and second wiring 21C may be disposed on first surface 10A.

Figure 14:
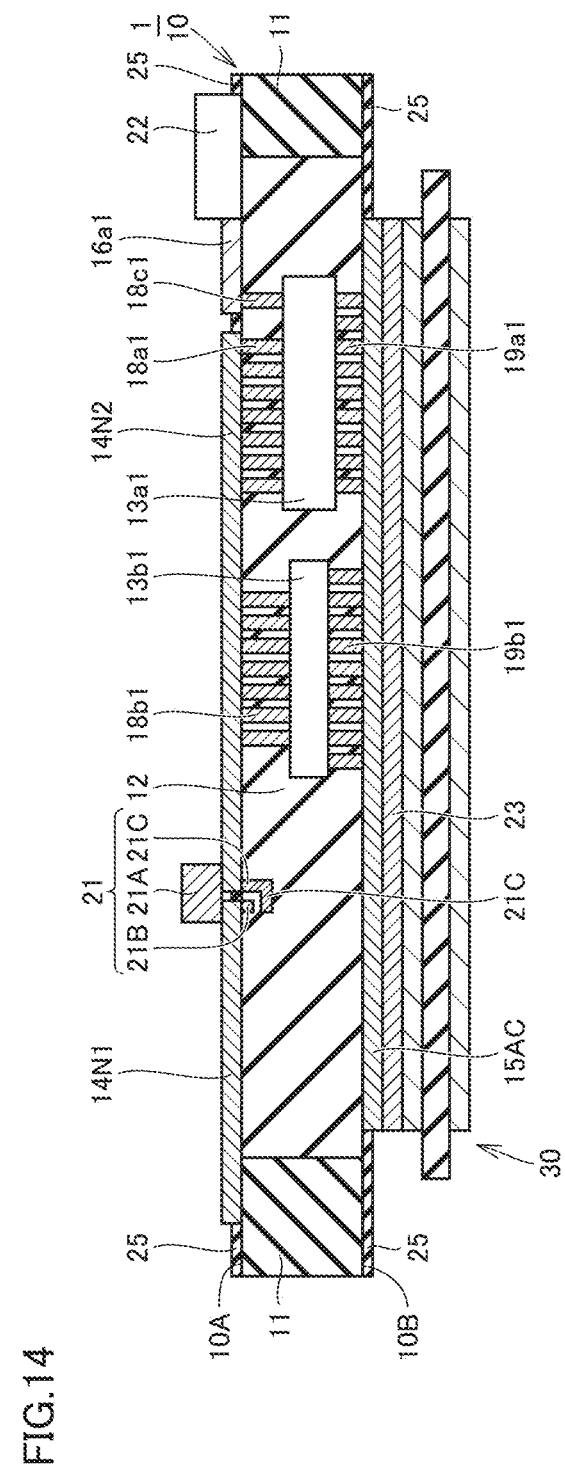
FIG. 14 is a cross-sectional view showing a modification to the semiconductor device according to the fourth embodiment.

As shown in FIG. 14, both of first wiring 21B and second wiring 21C may have a portion disposed in the interior of substrate 10. The whole of first wiring 21B and second wiring 21C may be disposed in the interior of substrate 10. Also in this case, first wiring 21B and second wiring 21C are arranged in parallel with each other in the interior of substrate 10. In semiconductor device 1 shown in FIG. 14, a space for arranging first wiring 21B is also not necessary on first surface 10A. Therefore, the area occupied by third electrode 14N of semiconductor device 1 shown in FIG. 14 is further increased by the amount of the space described above. As a result, in semiconductor device 1 shown in FIG. 14, the heat dissipation effect by third electrode 14N is further enhanced, compared with semiconductor device 1 shown in FIG. 12 and FIG. 13.

Fifth Embodiment

Figure 15:
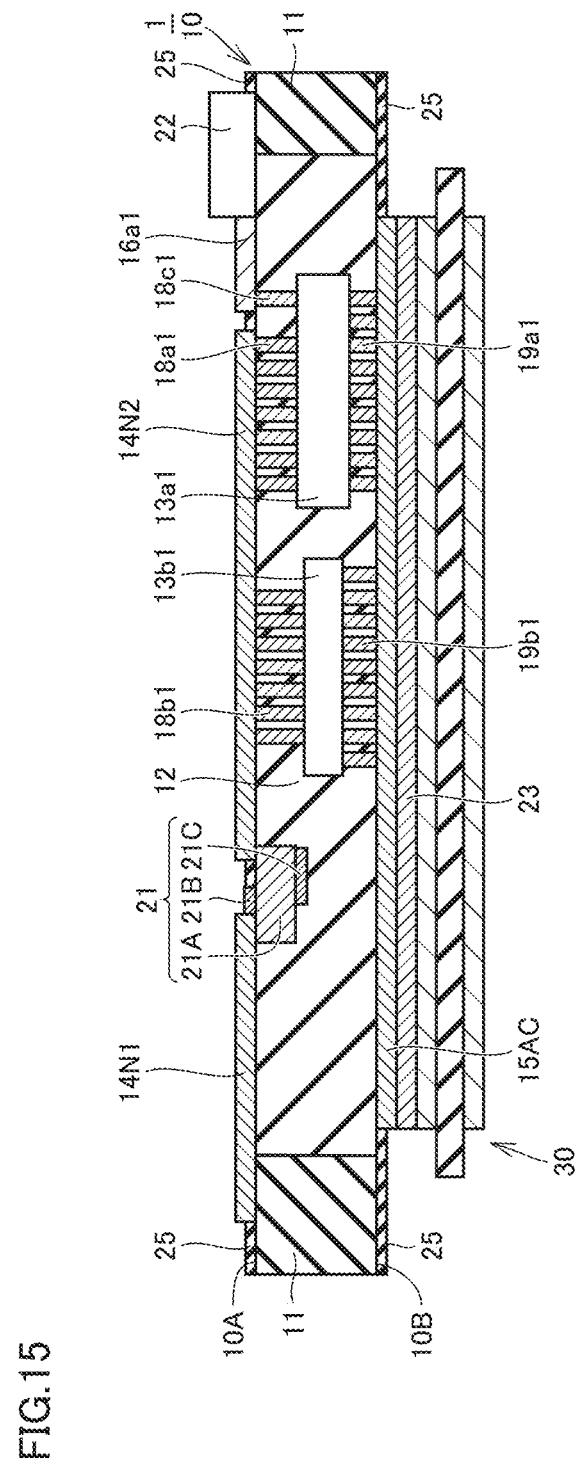
FIG. 15 is a cross-sectional view of a semiconductor device according to a fifth embodiment.

As shown in FIG. 15, semiconductor device 1 according to a fifth embodiment basically has a configuration similar to semiconductor device 1 according to the third embodiment but differs in that shunt resistor 21A of first current detector 21 is disposed in the interior of substrate 10.

The one end of shunt resistor 21A has, for example, an upper surface that is flush with first surface 10A and is connected to first portion 14N1 of third electrode 14N. The other end of shunt resistor 21A has, for example, an upper surface that is flush with first surface 10A and is connected to second portion 14N2 of third electrode 14N.

First wiring 21B is disposed, for example, on first surface 10A. Second wiring 21C has, for example, a buried portion buried in the interior of substrate 10.

First wiring 21B and second wiring 21C may be disposed on first surface 10A in the same manner as semiconductor device 1 shown in FIG. 9. Both of first wiring 21B and second wiring 21C may be disposed in the interior of substrate 10 in the same manner as semiconductor device 1 shown in FIG. 14.

Semiconductor device 1 according to the fifth embodiment basically has a configuration similar to semiconductor device 1 according to the third embodiment and therefore achieves an effect similar to that of semiconductor device 1 according to the third embodiment.

Furthermore, in semiconductor device 1 according to the fifth embodiment, a flat surface having an area equal to or larger than the area of IGBT elements 13a1, 13a2 is formed by first electrode 14P, second electrode 14AC, and third electrode 14N. Therefore, a not-shown radiator may be connected to the flat surface through a not-shown insulating substrate. Such a semiconductor device 1 has higher heat dissipation than semiconductor device 1 in which only the second surface 10B side is connected to a radiator through insulating substrate 30.

Furthermore, in semiconductor device 1 according to the fifth embodiment, at least one of first wiring 21B and second wiring 21C is disposed in the interior of substrate 10, whereby the heat dissipation effect by third electrode 14N is enhanced, compared with when both of first wiring 21B and second wiring 21C are disposed on first surface 10A.

Sixth Embodiment

Figure 16:
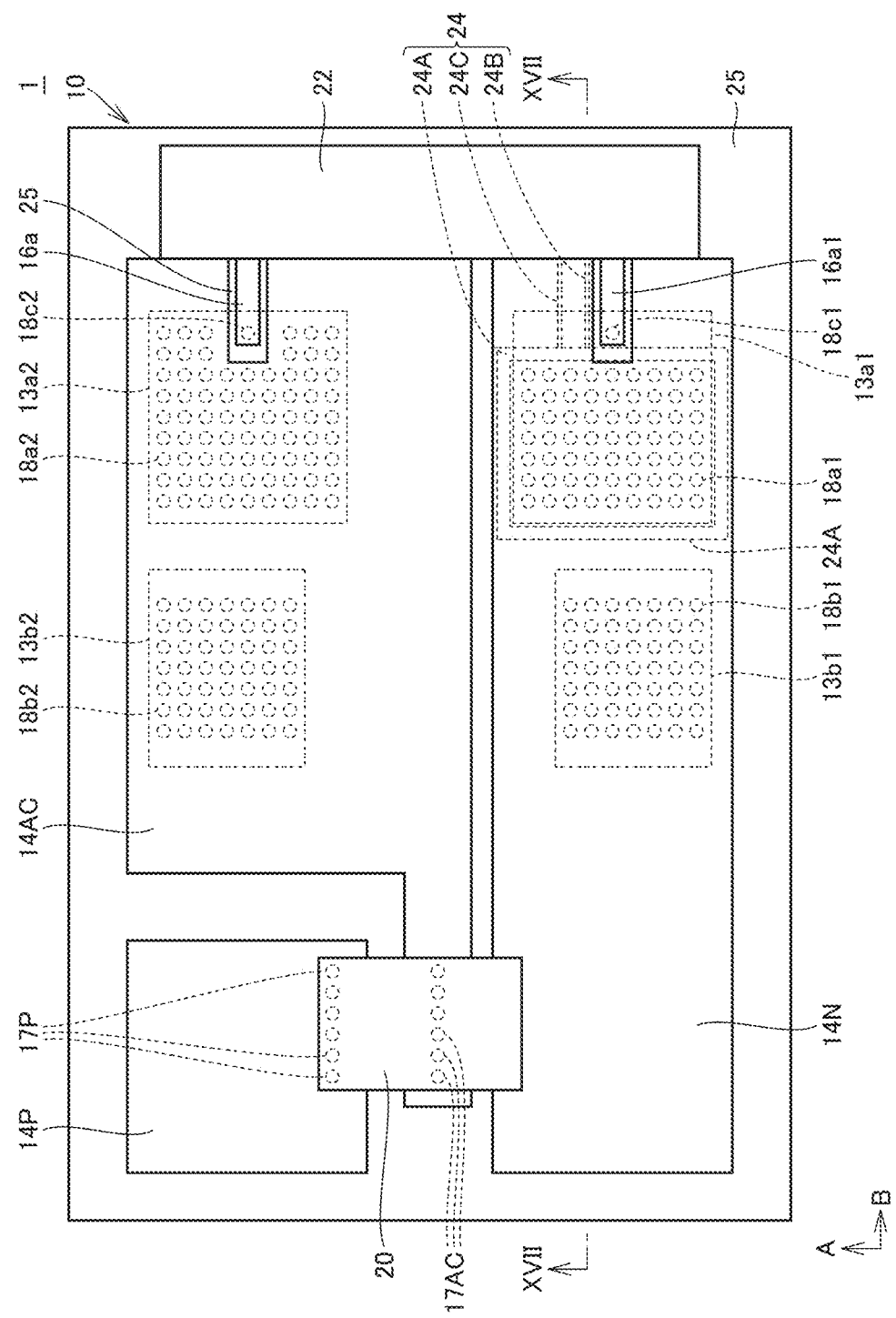
FIG. 16 is a top view of a semiconductor device according to a sixth embodiment.
Figure 17:
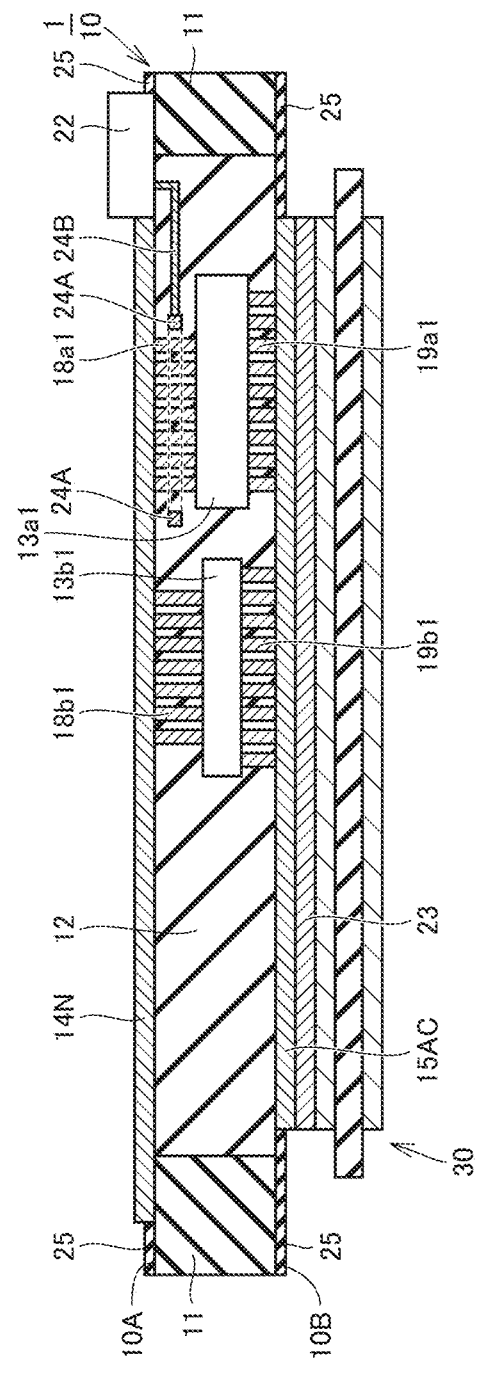
FIG. 17 is a cross-sectional view taken along arrow XVII-XVII in FIG. 16.

As shown in FIG. 16, semiconductor device 1 according to a sixth embodiment basically has a configuration similar to semiconductor device 1 according to the second embodiment but differs in that it further includes a second current detector 24.

Second current detector 24 is provided so as to detect change in current flowing through seventh via 18a1 (third connection part). As shown in FIG. 16, second current detector 24 includes a magnetic flux detector 24A, third wiring 24B, and fourth wiring 24C. Magnetic flux detector 24A is provided so as to detect change in magnetic flux in the periphery of seventh via 18a1 that is caused by change in current flowing through seventh via 18a1. Magnetic flux detector 24A is disposed in the interior of substrate 10 and provided so as to surround seventh via 18a1. Preferably, magnetic flux detector 24A is provided so as to surround the center portion of seventh via 18a1 in the third direction.

Magnetic flux detector 24A has, for example, a current transformer, a Hall current sensor, or a Rogowski coil. Magnetic flux detector 24A has a third connection terminal connected to controller 22 through third wiring 24B and a fourth connection terminal connected to controller 22 through fourth wiring 24C. Third wiring 24B and fourth wiring 24C are disposed, for example, in the interior of substrate 10.

Controller 22 is provided so as to control the switching operation of IGBT elements 13a1, 13a2 in accordance with a current value or the amount of change in current detected by first current detector 21. In controller 22, for example, any given determination value is set in advance for a value of reverse current (recovery current value) flowing from the cathode electrode to the anode electrode of each of freewheel diodes 13b1, 13b2 at the time of switching. Controller 22 performs, for example, control of decreasing the switching speed when a current value detected by first current detector 21 exceeds the determination value.

Since semiconductor device 1 according to the sixth embodiment includes second current detector 24, the switching speed is decreased by controller 22 when a current value detected by second current detector 24 exceeds the determination value. As a result, in semiconductor device 1 according to the sixth embodiment, excessive heat generation and destruction of IGBT elements 13a1, 13a2 and freewheel diodes 13b1, 13b2 are prevented.

Furthermore, in semiconductor device 1 according to the sixth embodiment, since second current detector 24 is disposed in the interior of substrate 10, higher integration is achieved, compared with semiconductor device 1 in which first current detector 21 shown in FIG. 9 is disposed on the exterior of substrate 10.

Modifications

In semiconductor device 1 according to the sixth embodiment, magnetic flux detector 24A may be provided so as to surround seventh via 18a1 and ninth via 18b1. In this manner, second current detector 24 can detect change in current flowing through seventh via 18a1 and ninth via 18b1.

Second current detector 24 may include a plurality of magnetic flux detectors 24A provided so as to individually surround seventh via 18a1 and ninth via 18b1.

Second current detector 24 may include magnetic flux detector 24A provided so as to surround third via 18a2. Magnetic flux detector 24A may be provided so as to surround third via 18a2 and fifth via 18b2. Second current detector 24 may include a plurality of magnetic flux detectors 24A provided so as to individually surround third via 18a2 and fifth via 18b2.

Semiconductor device 1 according to the third to sixth embodiments does not necessarily include snubber circuit element 20.

Seventh Embodiment

A power conversion device 200 according to a seventh embodiment is configured such that semiconductor device 1 according to any one of the foregoing first to sixth embodiments is applied to a three-phase inverter.

Figure 18:
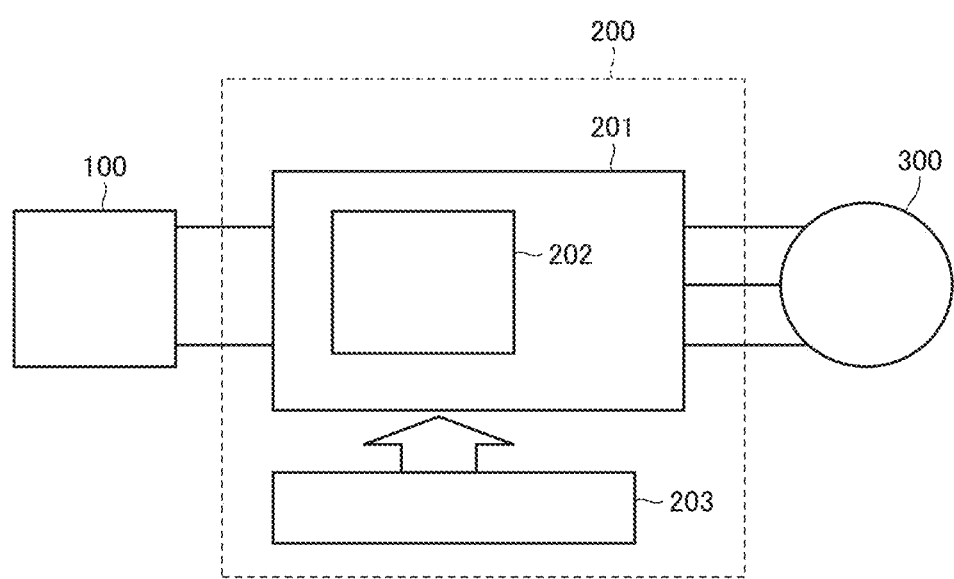
FIG. 18 is a block diagram showing a configuration of a power conversion system to which a power conversion device according to a seventh embodiment is applied.

FIG. 18 is a block diagram showing a configuration of a power conversion system to which power conversion device 200 according to the seventh embodiment is applied.

The power conversion system shown in FIG. 18 includes a power supply 100, power conversion device 200, and a load 300. Power supply 100 is a direct-current power supply and supplies DC power to power conversion device 200. Power supply 100 can be configured with a variety of power supplies, for example, can be configured with a DC system, a solar cell, or a storage battery, or may be configured with a rectifying circuit or an AC/DC converter connected to an AC system. Power supply 100 may be configured with a DC/DC converter that converts DC power output from a DC system to a predetermined power.

Power conversion device 200 is a three-phase inverter connected between power supply 100 and load 300, and converts DC power supplied from power supply 100 into AC power and supplies the AC power to load 300. As shown in FIG. 18, power conversion device 200 includes a main conversion circuit 201 to convert DC power into AC power and output the AC power and a control circuit 203 to output a control signal for controlling main conversion circuit 201 to main conversion circuit 201.

Load 300 is a three-phase electric motor driven by AC power supplied from power conversion device 200. Load 300 is not limited to a specific application and is an electric motor installed in a variety of electric devices, for example, and used as an electric motor for a hybrid vehicle, an electric vehicle, a rail vehicle, an elevator, or an air conditioner.

The detail of power conversion device 200 is described below. Main conversion circuit 201 includes switching elements and freewheel diodes, and the switching elements perform switching to convert DC power supplied from power supply 100 into AC power, which is supplied to load 300.

Main conversion circuit 201 includes a semiconductor module 202 corresponding to any one of semiconductor devices 1 according to the foregoing first to sixth embodiments. IGBT element 13a1 is configured as a switching element in the lower arm. IGBT element 13a2 is configured as a switching element in the upper arm.

There are a variety of specific circuit configurations for main conversion circuit 201. Main conversion circuit 201 is, for example, a two-level three-phase full-bridge circuit and configured with six switching elements and six freewheel diodes connected in anti-parallel with the respective switching elements. The six switching elements are connected two by two in series to form upper and lower arms, and the upper and lower arms constitute each phase (U phase, V phase, W phase) of the full-bridge circuit. The output terminals of the upper and lower arms, that is, three output terminals of main conversion circuit 201 are connected to load 300.

Main conversion circuit 201 includes a drive circuit (not shown) for driving each switching element. The drive circuit may be contained in semiconductor module 202, or the drive circuit may be provided separately from semiconductor module 202. The drive circuit generates a drive signal for driving a switching element of main conversion circuit 201 and supplies the drive signal to the control electrode of the switching element of main conversion circuit 201. Specifically, in accordance with a control signal from control circuit 203 described later, a drive signal for turning on a switching element and a drive signal for turning off a switching element are output to the control electrode of each switching element. When the switching element is to be kept on, the drive signal is a voltage signal (ON signal) equal to or higher than a threshold voltage of the switching element. When the switching element is to be kept off, the drive signal is a voltage signal (OFF signal) equal to or lower than a threshold voltage of the switching element.

Control circuit 203 controls the switching elements of main conversion circuit 201 such that a desired power is supplied to load 300. The controller 22 described above constitutes at least a part of control circuit 203. Control circuit 203 calculates the time (ON time) during which each switching element of main conversion circuit 201 is to be turned on, based on power to be supplied to load 300. For example, main conversion circuit 201 can be controlled by PWM control that modulates the ON time of the switching elements in accordance with a voltage to be output. Then, a control command (control signal) is output to the drive circuit of main conversion circuit 201 such that an ON signal is output to a switching element to be turned on and an OFF signal is output to a switching element to be turned off, at each point of time. The drive circuit outputs an ON signal or an OFF signal as a drive signal to the control electrode of each switching element in accordance with this control signal.

Power conversion device 200 according to the seventh embodiment includes main conversion circuit 201 including semiconductor device 1 according to any one of the first to sixth embodiments and therefore has high reliability even in high-speed switching operation.

In the present embodiment, an example in which the present invention is applied to a two-level three-phase inverter has been described. However, the present invention is not limited thereto and can be applied to a variety of power conversion devices. Although the present invention is applied to a two-level power conversion device in the present embodiment, the present invention may be applied to a three-level or multi-level power conversion device, or the present invention may be applied to a single-phase inverter when power is supplied to a single-phase load. When power is supplied to a DC load or the like, the present invention can also be applied to a DC/DC converter or an AC/DC converter.

The power conversion device employing the present invention is not limited to a case where the aforementioned load is an electric motor, and can be used as, for example, a power supply device for an electric spark machine, a laser beam machine, an induction heating cooker, or a wireless charging system, or used as a power conditioner for a photovoltaic system or a power storage system.

Although embodiments of the present invention have been described above, the foregoing embodiments are susceptible to various modifications. The scope of the present invention is not intended to be limited to the foregoing embodiments. The scope of the present invention is shown in the claims, and it is intended that all modifications that come within the meaning and range of equivalence to the claims are embraced here.

REFERENCE SIGNS LIST 1 semiconductor device, 10 substrate, 10A first surface, 10B second surface, 11 core material, 12 sealing resin material, 13a2, 13a1 IGBT, 13b1 freewheel diode, 13b1, 13b2 freewheel diode, 13b2 freewheel diode, 13b2, 13b1 freewheel diode, 14P first electrode, 14AC second electrode, 14N third electrode, 14N1 first portion, 14N2 second portion, 15P fourth electrode, 15AC fifth electrode, 16a1, 16a2 control electrode, 17AC second via, 17P first via, 18a1 seventh via, 18a2 third via, 18b1 ninth via, 18b2 fifth via, 18c2 eleventh via, 18c1 twelfth via, 19a1 eighth via, 19a2 fourth via, 19b2 sixth via, 19b1 tenth via, 20 snubber circuit element, 21 first current detector, 21A shunt resistor, 21B first wiring, 21C second wiring, 21D exposed segment, 21E buried segment, 22 controller, 23 connection member, 24 second current detector, 24A magnetic flux detector, 24B third wiring, 24C fourth wiring, 25 protective film, 30 insulating substrate, power supply 100, power conversion device 200, main conversion circuit 201, semiconductor module 202, control circuit 203, load 300.

The invention claimed is:

1. A semiconductor device comprising:
a substrate having a first surface and a second surface on a side opposite to the first surface;
a first electrode, a second electrode, and a third electrode on the first surface;
a first semiconductor element and a second semiconductor element in an interior of the substrate;
a first wiring group electrically connecting the first electrode to the first semiconductor element;
a second wiring group electrically connecting the first semiconductor element to the second electrode;
a third wiring group electrically connecting the third electrode to the second semiconductor element; and
a fourth wiring group electrically connecting the second semiconductor element to the second electrode, wherein
the first wiring group includes a first connection part in the interior of the substrate and extending in a direction intersecting the first surface,
the fourth wiring group includes a second connection part in the interior of the substrate and extending in the intersecting direction,
under a condition where a voltage is applied between the first electrode and the third electrode to cause current to flow through the second electrode, a direction of current flowing through the first connection part is opposite to a direction of current flowing through the second connection part,
the first wiring group further includes a fourth electrode formed on the second surface,
the fourth wiring group further includes a fifth electrode formed on the second surface.
the first connection part connects the first electrode and the fourth electrode, and
the second connection part connects the second electrode and the fifth electrode.

2. The semiconductor device according to claim 1, wherein
the first electrode and the second electrode have a first pair of opposing regions having a first pair of opposing sides facing at a distance from each other,
the fourth electrode and the fifth electrode have a second pair of opposing regions having a second pair of opposing sides facing at a distance from each other,
one end of each of the first connection part and the second connection part is connected to a corresponding one of the first pair of opposing regions, and
the other end of each of the first connection part and the second connection part is connected to a corresponding one of the second pair of opposing regions.

3. The semiconductor device according to claim 1, further comprising a snubber circuit connecting the first electrode and the third electrode, wherein
the snubber circuit overlaps the first connection part in a two-dimensional view.

4. The semiconductor device according to claim 3, wherein
the third electrode has a first portion connected to the snubber circuit and a second portion connected to the second semiconductor element, and
the semiconductor device further comprises a first current detector between the first portion and the second portion, the first current detector detecting change in current flowing through the third electrode.

5. The semiconductor device according to claim 4, further comprising a controller to control the first semiconductor element and the second semiconductor element, wherein
the first current detector includes a shunt resistor, first wiring, and second wiring, the shunt resistor having one end connected to the first portion and the other end connected to the second portion, the first wiring connecting the one end of the shunt resistor and the controller, the second wiring connecting the other end of the shunt resistor and the controller.

6. The semiconductor device according to claim 5, wherein the shunt resistor, the first wiring, and the second wiring are on the first surface.

7. The semiconductor device according to claim 5, wherein at least one of the first wiring and the second wiring has a portion in the interior of the substrate.

8. The semiconductor device according to claim 7, wherein the shunt resistor is in the interior of the substrate.

9. The semiconductor device according to claim 4, wherein
a material forming the first current detector includes a material having a resistance temperature coefficient below a predetermined value, and
the first current detector is formed by plating or deposition.

10. The semiconductor device according to claim 3, further comprising:

a third connection part in the interior of the substrate and connecting the second semiconductor element and the third electrode; and a second current detector to detect change in current flowing through the third connection part, wherein the second current detector has a magnetic flux detector to detect change in magnetic flux, and the magnetic flux detector is in the interior of the substrate and surrounds the third connection part.

11. The semiconductor device according to claim 1, further comprising a snubber circuit connecting the first electrode and the third electrode, wherein the snubber circuit overlaps the first connection part in a two-dimensional view.

12. The semiconductor device according to claim 11, wherein the third electrode has a first portion connected to the snubber circuit and a second portion connected to the second semiconductor element, and the semiconductor device further comprises a first current detector between the first portion and the second portion, the first current detector detecting change in current flowing through the third electrode.

13. The semiconductor device according to claim 2, further comprising a snubber circuit connecting the first electrode and the third electrode, wherein the snubber circuit overlaps the first connection part in a two-dimensional view.

14. The semiconductor device according to claim 13, wherein the third electrode has a first portion connected to the snubber circuit and a second portion connected to the second semiconductor element, and the semiconductor device further comprises a first current detector between the first portion and the second portion, the first current detector detecting change in current flowing through the third electrode.

15. A power conversion device comprising:

a main conversion circuit including a semiconductor device, the main conversion circuit converting input power and outputting the converted power; and a control circuit to output a control signal for controlling the main conversion circuit to the main conversion circuit, wherein the semiconductor device includes:

a substrate having a first surface and a second surface on a side opposite to the first surface;

a first electrode, a second electrode, and a third electrode on the first surface;

a first semiconductor element and a second semiconductor element in an interior of the substrate;

a first wiring group electrically connecting the first electrode to the first semiconductor element;

a second wiring group electrically connecting the first semiconductor element to the second electrode;

a third wiring group electrically connecting the third electrode to the second semiconductor element; and a fourth wiring group electrically connecting the second semiconductor element to the second electrode, and wherein the first wiring group includes a first connection part in the interior of the substrate and extending in a direction intersecting the first surface, the fourth wiring group includes a second connection part in the interior of the substrate and extending in the intersecting direction, under a condition where a voltage is applied between the first electrode and the third electrode to cause current to flow through the second electrode, a direction of current flowing through the first connection part is opposite to a direction of current flowing through the second connection part, the first wiring group further includes a fourth electrode formed on the second surface, the fourth wiring group further includes a fifth electrode formed on the second surface, the first connection part connects the first electrode and the fourth electrode, and the second connection part connects the second electrode and the fifth electrode.

16. A semiconductor device comprising:

a substrate having a first surface and a second surface on a side opposite to the first surface;

a first electrode, a second electrode, and a third electrode on the first surface;

a first semiconductor element and a second semiconductor element in an interior of the substrate;

a first wiring group electrically connecting the first electrode to the first semiconductor element;

a second wiring group electrically connecting the first semiconductor element to the second electrode;

a third wiring group electrically connecting the third electrode to the second semiconductor element;

a fourth wiring group electrically connecting the second semiconductor element to the second electrode; and a snubber circuit connecting the first electrode and the third electrode, wherein the first wiring group includes a first connection part in the interior of the substrate and extending in a direction intersecting the first surface, the fourth wiring group includes a second connection part in the interior of the substrate and extending in the intersecting direction, under a condition where a voltage is applied between the first electrode and the third electrode to cause current to flow through the second electrode, a direction of current flowing through the first connection part is opposite to a direction of current flowing through the second connection part, the third electrode has a first portion connected to the snubber circuit and a second portion connected to the second semiconductor element, and the semiconductor device further comprises a first current detector between the first portion and the second portion, the first current detector detecting change in current flowing through the third electrode.

* * * * *